United States Patent [19]

Suzuki et al.

[11] Patent Number: 5,703,829
[45] Date of Patent: Dec. 30, 1997

[54] SYNCHRONOUS TYPE SEMICONDUCTOR MEMORY DEVICE WHICH CAN BE ADAPTED TO HIGH FREQUENCY SYSTEM CLOCK SIGNAL

[75] Inventors: Tomio Suzuki; Shigeru Mori; Takayuki Miyamoto, all of Hyogo, Japan

[73] Assignee: Mitsubishi Denki Kabushiki Kaisha, Tokyo, Japan

[21] Appl. No.: 681,428

[22] Filed: Jul. 23, 1996

[30] Foreign Application Priority Data

Dec. 28, 1995 [JP] Japan .................... 7-343511

[51] Int. Cl.$^6$ .................... G11C 8/00
[52] U.S. Cl. ............ 365/233; 365/230.08; 365/189.05; 365/239
[58] Field of Search ............ 365/233, 230.06, 365/230.08, 189.05, 239

[56] References Cited

U.S. PATENT DOCUMENTS

| | | | |
|---|---|---|---|
| 5,278,803 | 1/1994 | Wanner | 365/233 |
| 5,305,271 | 4/1994 | Watanabe | 365/205 |
| 5,349,566 | 9/1994 | Merritt et al. | 365/233.5 |
| 5,402,388 | 3/1995 | Wojcicki et al. | 365/233 |
| 5,436,865 | 7/1995 | Kitazawa | 365/194 |
| 5,444,666 | 8/1995 | Oh | 365/230.08 |
| 5,452,261 | 9/1995 | Chung et al. | 365/233 |
| 5,455,803 | 10/1995 | Kodama | 365/233 |
| 5,488,580 | 1/1996 | Park | 365/189.05 |
| 5,532,961 | 7/1996 | Mori et al. | 365/189.05 |
| 5,566,124 | 10/1996 | Fudeyasu et al. | 365/239 X |

FOREIGN PATENT DOCUMENTS

| | | | |
|---|---|---|---|
| 4-263191 | 9/1992 | Japan . | |
| 5-20868 | 1/1993 | Japan . | |
| 2 246 004 | 1/1992 | United Kingdom | G11C 7/00 |

*Primary Examiner*—David C. Nelms
*Assistant Examiner*—Huan Hoang
*Attorney, Agent, or Firm*—Lowe, Price, LeBlanc & Becker

[57] ABSTRACT

In a pipeline burst EDO operation, a latency circuit 215 detects change of an internal column address strobe signal ZCASF from an active state to a non-active sate in the first cycle, and brings a signal OEMB into an active state. When a writing operation mode is specified, and an internal output enable signal ZOEF is in an active state, an output buffer control signal OEM attains an active state in response to the first activation edge of the internal column address strobe signal ZCASF after activation of the signal OEMB. Since the signal OEMB has already been in an active state in the first cycle of the signal ZCASF, a delay time for change of the signal OEM in response to activation of the signal ZCASF in the second cycle can be decreased.

11 Claims, 18 Drawing Sheets

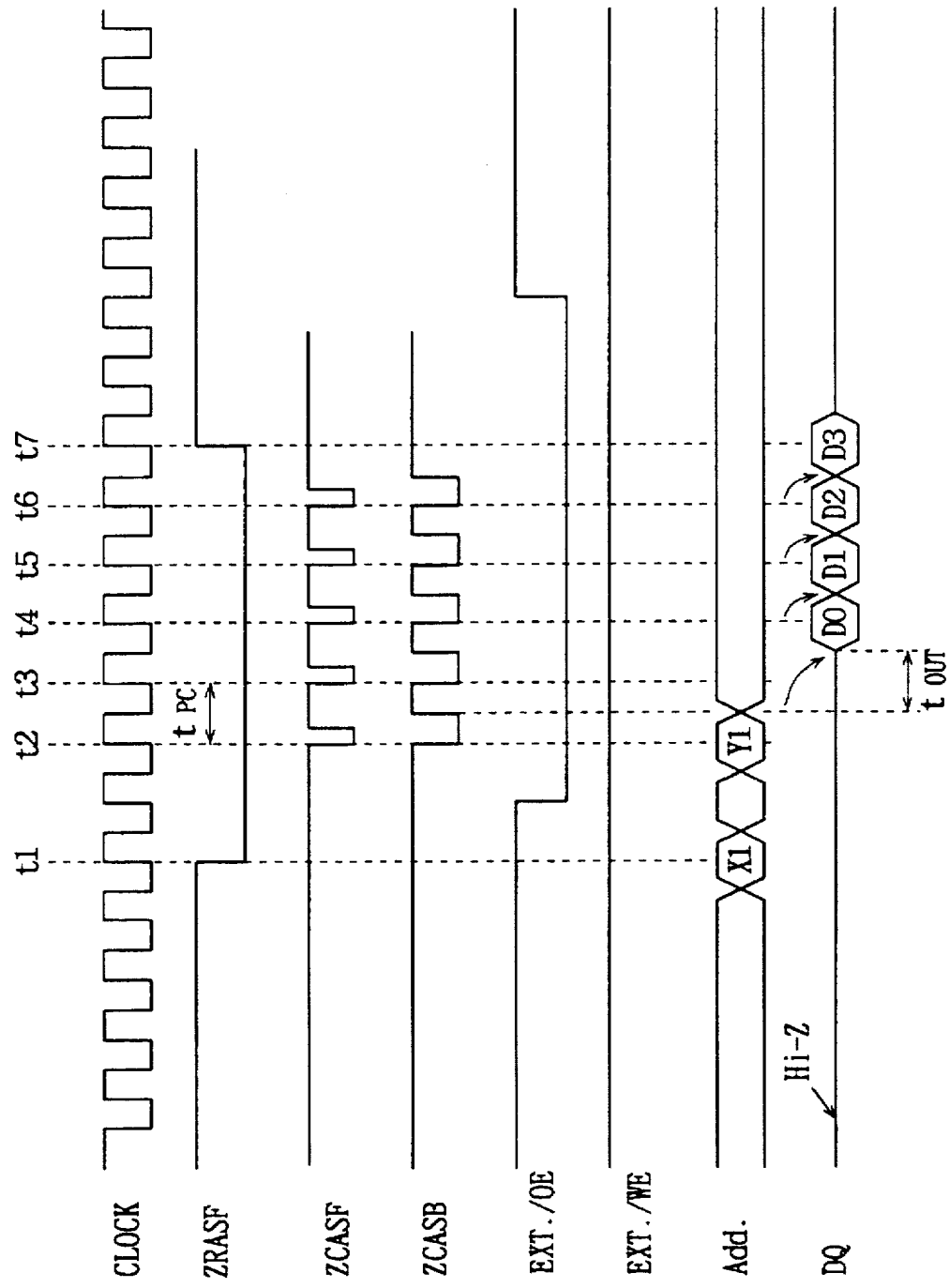

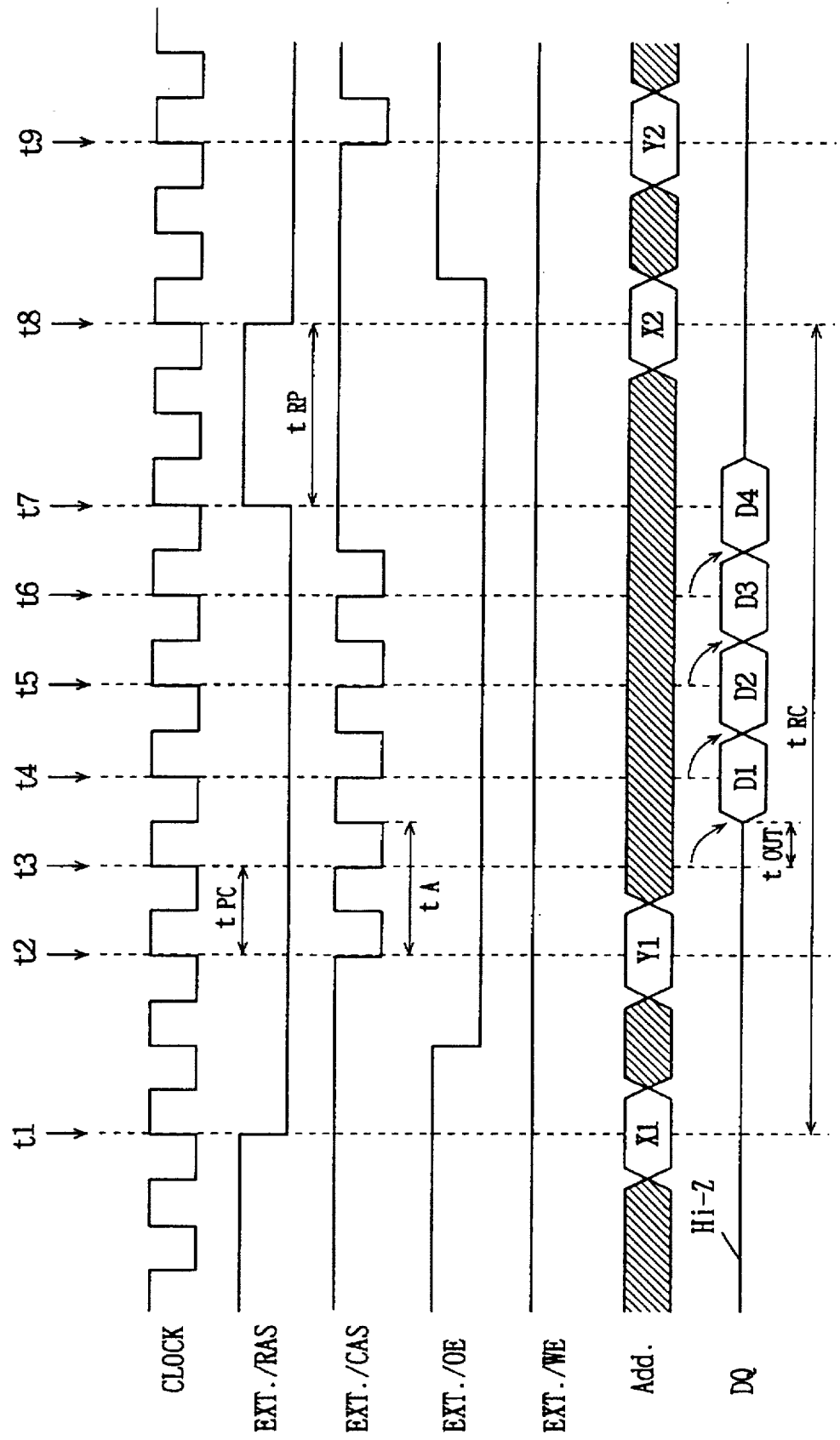

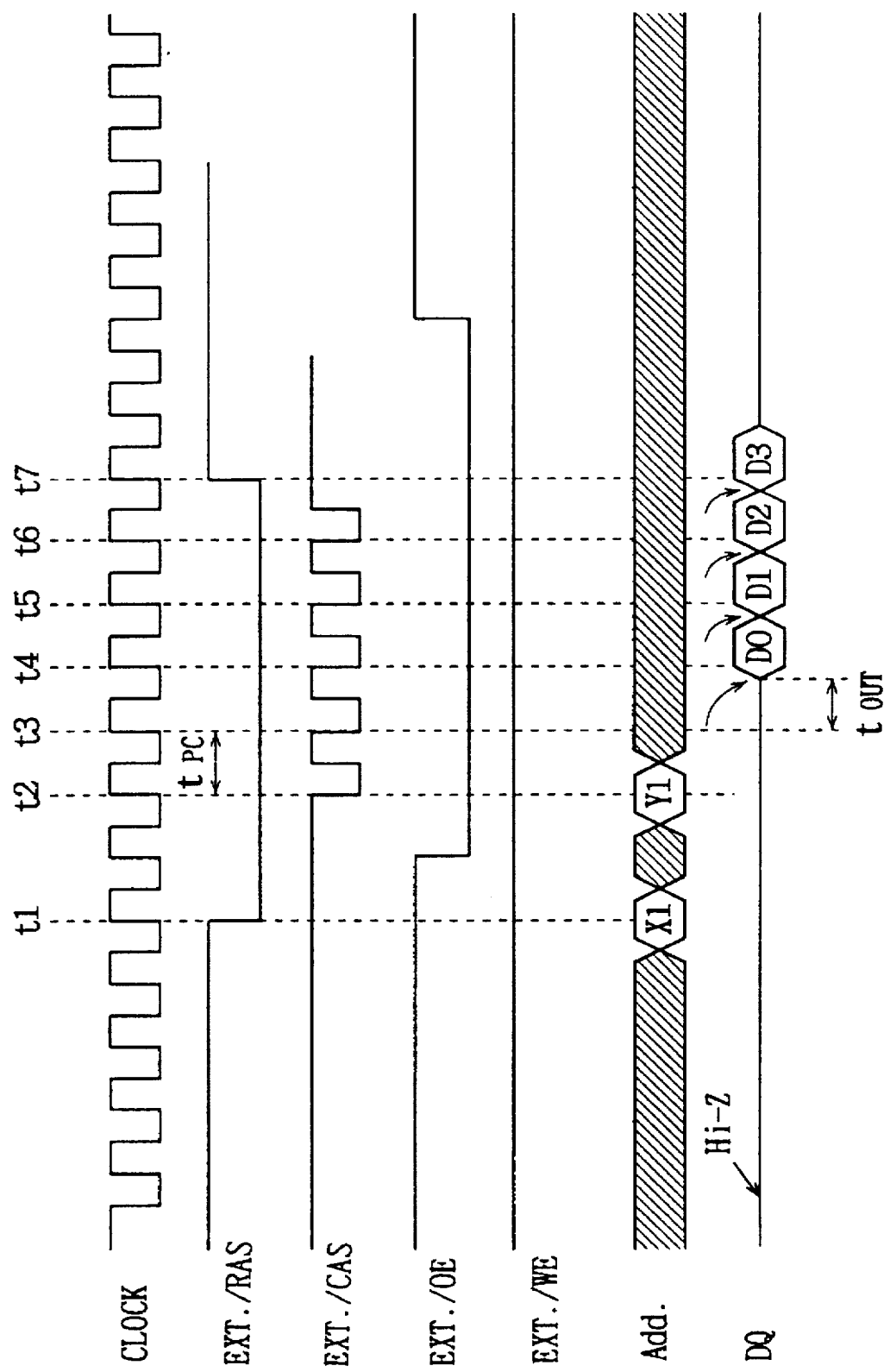

5,703,829

SYNCHRONOUS TYPE SEMICONDUCTOR MEMORY DEVICE WHICH CAN BE ADAPTED TO HIGH FREQUENCY SYSTEM CLOCK SIGNAL

BACKGROUND OF THE INVENTION

1. Field of the Invention

The present invention generally relates to semiconductor memory devices, and more particularly, to a dynamic type semiconductor memory device which operates at a high speed. More particularly, the present invention relates to a semiconductor memory device which sequentially outputs at a high speed read data from a plurality of memory cells read out simultaneously in synchronism with a cycle of change of an external signal.

2. Description of the Background Art

Although a so-called nibble mode, a hyper page mode and the like are known as an operation mode of a high speed semiconductor memory device, a pipeline burst mode is known as an operation mode enabling a data reading operation at a higher speed.

FIG. 21 is a timing chart showing a data reading operation of a semiconductor memory device having this pipeline burst mode. Referring to FIG. 21, the data reading operation in the pipeline burst mode will be described hereinafter.

At time t1, in response to an external row address strobe signal EXT./RAS attaining a logical low or L level (in this specification and the drawings, / before a signal indicates that the low level is active), an X address signal X1 is entered. Then, at time t2, in response to an external column address strobe signal EXT./CAS attaining the L level, a Y address signal Y1 is entered. As a result, 4-bit memory cells, for example, are selected for every one data output terminal DQ. Whenever column address strobe signal EXT./CAS is brought into an active state (L level) from the next EXT./CAS cycle, that is, from time t3, each bit of 4-bit memory cell data is sequentially provided. More specifically, at times t3, t4, t5 and t6, data D1, D2, D3 and D4 are provided to data output terminal DQ by pulling down column address strobe signal EXT./CAS.

In this pipeline burst mode, data of memory cells selected by a column address input at time t2 may be provided from the next EXT./CAS cycle, that is, a cycle including time t3 at which column address strobe signal EXT./CAS attains the L level. Therefore, a cycle time tPC at the time of data reading can be shorter than time tA required from designation of a column address to reading of data. More specifically, data can be provided in a cycle period of a clock signal CLOCK, enabling reading of data at a high speed.

In this pipeline burst mode, if another column address is input during output of data, memory cell data of four addresses are selected according to this column address. Therefore, by sequential input of another column address to memory cells of the same row address, data can be read out continuously.

In other words, a large amount of data can be transferred at a high speed to a CPU (Central Processing Unit) which is provided externally. In response to a logical high or H level of both signals EXT./RAS and EXT./CAS, data reading is completed, and data output terminal DQ is brought into a high impedance state.

A semiconductor memory device operating in such a high speed operation mode as described above is generally used as the main memory of a microprocessor. Such a semiconductor memory device is generally controlled by a controller (DRAM controller) generating a row address signal, a column address signal, row address strobe signal EXT./RAS, column address strobe signal EXT./CAS, an output enable signal EXT./OE and a write enable signal EXT./WE according to an instruction given by the microprocessor.

The microprocessor and the controller operate in synchronism with clock signal CLOCK. Therefore, the row address signal, the column address signal and signals EXT./RAS, EXT./CAS, EXT./OE and EXT./WE generated by the controller are in synchronism with clock signal CLOCK.

Referring to FIG. 21, four memory cell data specified by row address (X address) X1 input at time t1 and column address (Y address) Y1 input at time t2 are read out. After that, when a column address strobe signal EXT./CAS changes from a non-active state (H level) to an active state (L level) in response to the rising edge of signal CLOCK at time t3, an output buffer circuit is activated in order to output read data D1 at the first bit to data output terminal DQ.

As described above, in order to shorten cycle time tPC in general, output of the first data D1 is triggered by the activation edge (time t3) of signal CLOCK in a cycle following to the cycle including the activation edge of signal CLOCK at which column address Y1 is entered.

More specifically, in the internal circuitry of the semiconductor memory device, after detecting activation (change from the H level to the L level) of signal EXT./CAS, for example, the number of the activation is counted. After detecting the second activation, for example, data output to data output terminal DQ is to be initiated after a predetermined time $t_{out}$ required from the detection to driving of the output buffer.

Since this predetermined time $t_{out}$ is determined depending on the counting operation of activation of signal EXT./CAS in the internal circuitry and a time required for the activation operation of the output buffer based on the counting operation, it has a lower limit value. Therefore, even if it is intended to implement higher speed operation by shortening cycle time tPC of signal CLOCK, there is a limit to the high speed operation due to this time $t_{out}$.

In order to explain the circumstances in detail, a timing chart of the pipeline burst operation is shown in FIG. 22 in the case where cycle time tPC of signal CLOCK is shortened.

More specifically, the timing chart of FIG. 22 corresponds to that in FIG. 21, with time $t_{out}$ made constant and cycle time tPC of signal CLOCK made shorter.

Referring to FIG. 22, at time t2, in response to the first activation edge of column address strobe signal EXT./CAS, column address signal Y1 is entered, and the data reading operation from memory cells belonging to a corresponding memory cell column is started. Then, the output operation of data D1 at the first bit to data input/output terminal DQ is started time $t_{out}$ after detection of the second activation edge of signal EXT./CAS at time t3. Outside the semiconductor memory device, the data reading operation from data input/output terminal DQ is carried out from the rising edge of signal CLOCK at time t4, that is, from a start point of a cycle following to the cycle including the activation edge of signal EXT./CAS at time t3.

If cycle time tPC is sufficiently short and as short as time $t_{out}$, however, the first data might not be output to data input/output terminal DQ at time t4, or an output data value might not sufficiently be defined.

More specifically, the data reading operation from memory cells is started at time t2 in response to entering of column address Y1. However, the data output operation to data input/output terminal DQ is triggered by time t3 which is the start time of the next cycle. Therefore, when cycle time tPC is sufficiently short, data output from the output buffer to data input/output terminal DQ might not be in time for time t4 which is the start time of a cycle following to the next cycle.

On the other hand, when cycle time tPC of external clock signal CLOCK is sufficiently short, a ratio of an active period (L level period) of column address strobe signal EXT./CAS which changes in synchronism with clock signal CLOCK to cycle time tPC may be decreased by the influence of a signal skew and the like.

Generally, in synchronism with change of column address strobe signal EXT./CAS, internal column address strobe signal ZCASF is generated within the semiconductor memory device, and based on this signal, a column-related operation in the semiconductor memory device is controlled. If a duty ratio of change of column address strobe signal EXT./CAS is decreased by the influence of a signal skew and the like, a duty ratio of internal column address strobe signal ZCASF is also decreased accordingly, and a sufficient drive time is not secured for a column-related reading circuit controlled by internal column address strobe signal ZCASF. For example, signal ZCASF is brought into a non-active state (H level) to transition to the next cycle before the output data value for data input/output terminal DQ is sufficiently defined, hampering normal data reading operation.

SUMMARY OF THE INVENTION

One object of the present invention is to provide a semiconductor memory device which can secure a sufficient margin for data output operation and operate at a high speed even when a cycle of a system clock signal becomes short.

Another object of the present invention is to provide a semiconductor memory device which can secure a sufficient margin for reading operation and operate at a high speed, even when a duty ratio of an external control signal is changed by the influence of a signal skew and the like.

In brief, according to one aspect of the present invention, the semiconductor memory device includes a memory cell array, a column selecting circuit, a plurality of data reading and amplifying circuits, a data output circuit, and an output buffer control circuit.

The memory cell array has a plurality of memory cells arranged in rows and columns. The column selecting circuit is activated at the time of activation of a column address strobe signal to select a plurality of columns of the memory cell array simultaneously according to a column address signal. The data reading and amplifying circuits amplify data of memory cells of a corresponding column among the plurality of columns. The data output circuit sequentially applies data amplified by the plurality of data reading and amplifying circuits to an output buffer in synchronism with activation of the column address strobe signal. The output buffer control circuit activates the output buffer in response to any transition of the column address strobe signal from an active state to a non-active state.

According to another aspect of the present invention, the semiconductor memory device includes a memory cell array, a synchronization signal generating circuit, a column selecting circuit, and a data input/output circuit.

The memory cell array has a plurality of memory cells arranged in rows and columns. The synchronization signal generating circuit generates an internal clock signal having a predetermined pulse length in synchronism with activation transition of a column address strobe signal. The column selecting circuit is activated at the time of activation of the internal clock signal to select a plurality of columns of the memory cell array simultaneously according to a column address signal. The data input/output circuit sequentially transmits and receives data between memory cells of a corresponding column among the plurality of columns and the outside world in synchronism with activation of the internal clock signal.

According to still another aspect of the present invention, the semiconductor memory device includes a memory cell array, a synchronization signal generating circuit, a column selecting circuit, a plurality of data reading and amplifying circuits, a data output circuit, and an output buffer control circuit.

The memory cell array has a plurality of memory cells arranged in rows and columns. The synchronization signal generating circuit generates an internal clock signal having a predetermined pulse length in synchronism with activation transition of a column address strobe signal. The column selecting circuit is activated at the time of activation of the internal clock signal to select a plurality of columns of the memory cell array simultaneously according to a column address signal. The data reading and amplifying circuits amplify data of memory cells of a corresponding column among the plurality of columns. The data output circuit sequentially provides data amplified by the plurality of data reading and amplifying circuits to an output buffer in synchronism with activation of the internal clock signal. The output buffer control circuit activates the output buffer in response to any transition of the internal clock signal from an active state to a non-active state.

Since an activation timing of the output buffer corresponds to transition of the external clock signal from an active state to a non-active state, an operation margin is increased by at least a half cycle, compared to the case where the output buffer is controlled corresponding to transition of the external clock signal from a non-active state to an active state. This is the main advantage of the present invention.

More specifically, even if a cycle time of the external clock signal becomes short, a normal data reading operation can be carried out.

According to the present invention, the reading operation is controlled by the internal clock signal. Therefore, even if there is a skew and the like in the external clock signal, the semiconductor memory device can operate stably at a high speed. This is another advantage of the present invention.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 20 is a timing chart showing reading operation in the pipeline burst EDO mode of a semiconductor memory device according to a third embodiment.

FIG. 21 is a timing chart showing reading operation in the pipeline burst EDO mode of a conventional semiconductor memory device.

FIG. 22 is a timing chart describing reading operation in the case where a cycle time is decreased in the conventional semiconductor memory device.

DESCRIPTION OF THE PREFERRED EMBODIMENTS

[First Embodiment]

Figure 1:
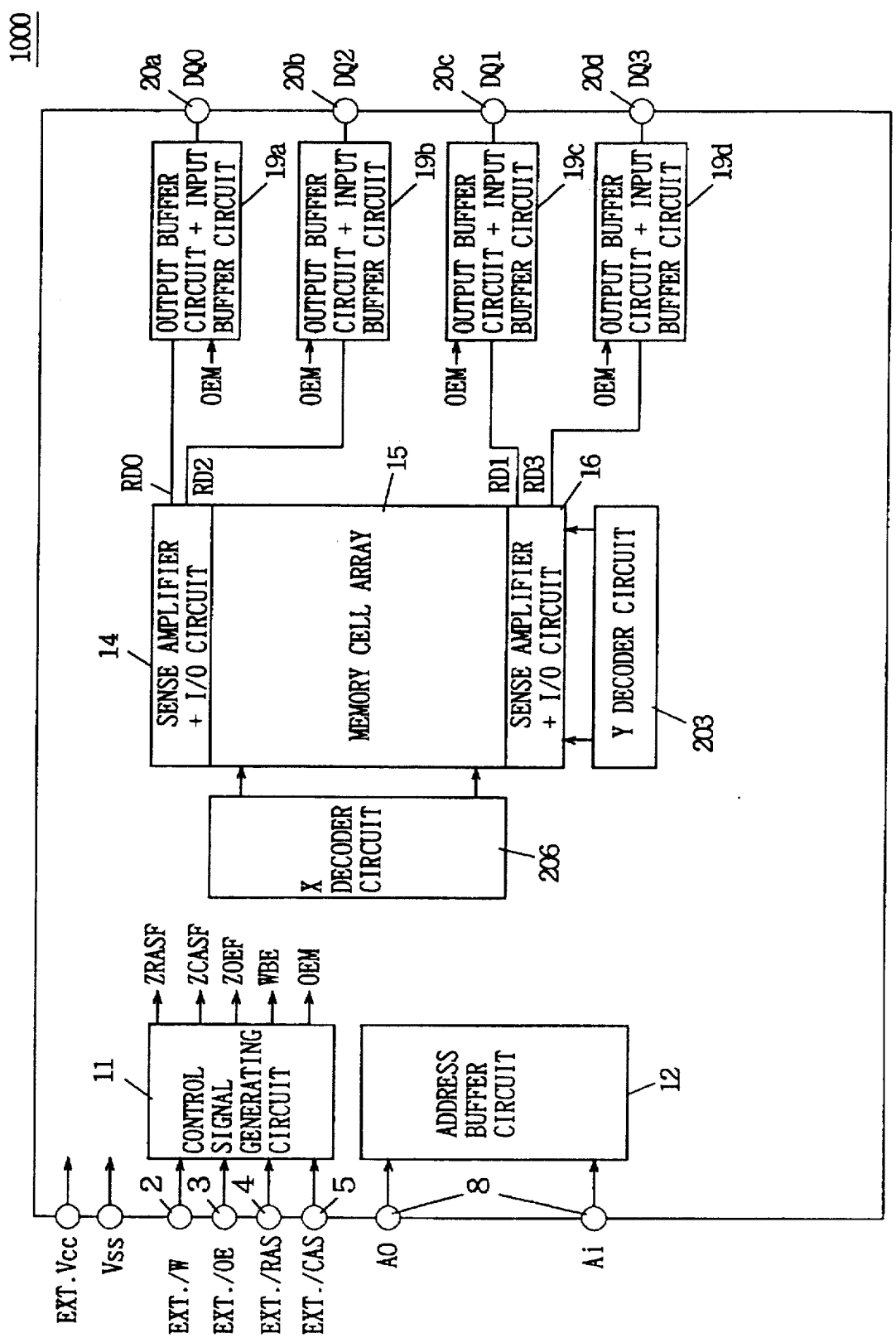
FIG. 1 is a schematic block diagram showing a configuration of a semiconductor memory device 1000 according to a first embodiment of the present invention.

Referring to FIG. 1, semiconductor memory device 1000 includes a control signal generating circuit 11 receiving external control signals EXT./W, EXT./OE, EXT./RAS and EXT./CAS applied through external control signal input terminals 2 to 5 to generate internal control signals, a memory cell array 15 having memory cells arranged in rows and columns, an address buffer circuit 12 receiving external address signals A0 to Ai applied through an address signal input terminal 8 to generate an internal row address signal and an internal column address signal under the control of control signal generating circuit 11, and an X decoder circuit 206 activated under the control of control signal generating circuit 11 to decode the internal row address signal applied from address buffer circuit 12 and to select a row (word line) of memory cell array 15.

Signal EXT./W applied to external control signal input terminal 2 is a write enable signal specifying data writing. Signal EXT./OE applied to external control signal input terminal 3 is an output enable signal specifying data output. Signal EXT./RAS applied to external control signal input terminal 4 is a row address strobe signal starting internal operation of the semiconductor memory device and determining an active period of the internal operation. During activation of signal EXT./RAS, circuits relating to operation of X decoder circuit 206 selecting the row of memory cell array 15 are brought into an active state. Signal EXT./CAS applied to external control signal input terminal 5 is a column address strobe signal, bringing circuits selecting a column in memory cell array 15 into an active state.

Control signal generating circuit 11 outputs an internal row address strobe signal ZRASF, an internal column address strobe signal ZCASF, an internal write enable signal WBE, and an internal output enable signal OEM in response to external row strobe signal EXT./RAS, external column strobe signal EXT./CAS, external write enable signal EXT./W, and external output enable signal EXT./OE, respectively.

Semiconductor memory device 1000 further includes a Y decoder circuit 203 activated under the control of control signal generating circuit 11 to decode the internal column address signal from address buffer circuit 12 and generate a column select signal selecting a column of memory cell array 15. Four columns are selected at a time, as will be described later, for one column select interconnection line through which the column select signal is transmitted, and 4-bit data are simultaneously read out from four memory cells belonging to crossing points between the selected row and these simultaneously selected four columns.

Semiconductor memory device 1000 further includes a sense amplifier sensing and amplifying data of memory cells connected to the selected row of memory cell array 15, an I/O circuit connecting the selected column of memory cell array 15 to a corresponding internal data bus in response to the column select signal from Y decoder circuit 203, and input/output buffer circuits 19a to 19d generating external read data DQ0 to DQ3 from internal read data RD0 to RD3 on the internal data bus during the data reading period to output the same to data input/output terminals 20a to 20d under the control of control signal generating circuit 11.

In FIG. 1, the sense amplifier and the I/O circuit are shown as one block 14 (16). In reading operation, input/output buffer circuits 19a to 19d are brought into an active state according to activation (change to the H level) of internal output enable signal OEM generated in control signal generating circuit 11 in response to external column address strobe signal EXT./CAS. In writing operation, input/output buffer circuits 19a to 19d are brought into an active state according to activation of internal write enable signal WBE generated in control signal generating circuit 11 in response to external write enable signal EXT./W.

Figure 2:
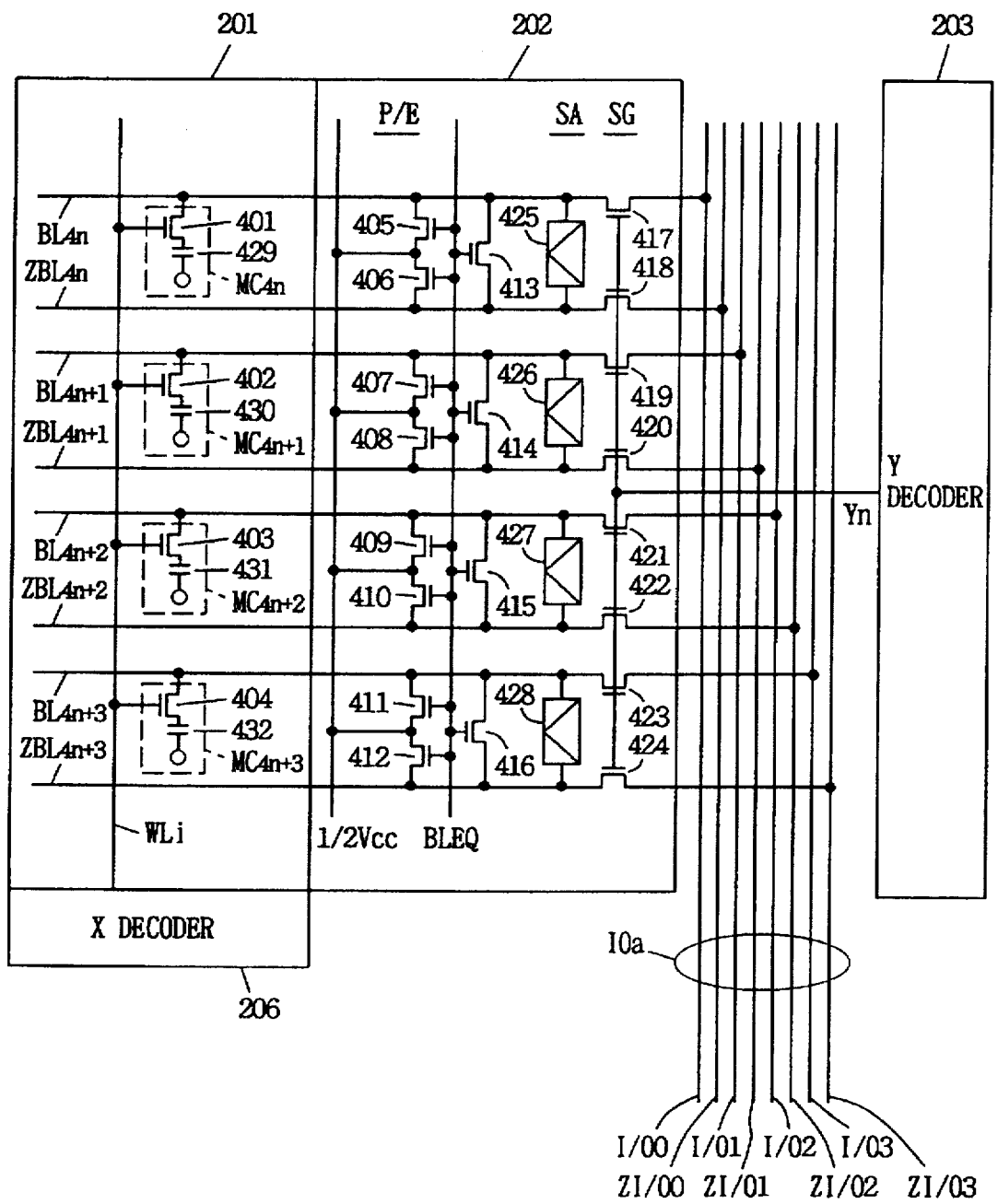
FIG. 2 is a circuit diagram of the main portion showing a configuration of a memory cell array and IO line pairs of the semiconductor memory device according to the first embodiment.

FIG. 2 shows one example of a specific configuration of memory cell array 15 of FIG. 1 and an array control circuit 202 arranged corresponding thereto. Referring to FIG. 2, an array block 201 in the memory cell array includes a plurality of memory cells MC arranged in a plurality of rows and columns. In FIG. 2, 4-bit memory cells MC4n to MC4+3 selected simultaneously are typically shown.

Array block 201 further includes paired bit lines BL and ZBL arranged corresponding to each column of the memory cells and a plurality of word lines WL arranged corresponding to each row of the memory cells. In FIG. 2, four pairs of bit lines BL4n, ZBL4n to BL4n+3, ZBL4n+3 and one word line WLi are typically shown. Data signals complementary to each other are transmitted on bit line BL (BL4n to BL4n+3) and bit line ZBL (ZBL4n to ZBL4n+3).

Memory cell MC4n is arranged corresponding to a crossing point of word line WLi and bit line BL4n. Memory cell MC4n includes a memory cell capacitor 429 for storing information and an access transistor 401 rendered conductive in response to a signal potential on word line WLi to connect capacitor 429 to bit line BL4n. Here, access transistor 401 is formed of an n channel MOS transistor. Memory cell MC4n+1 is arranged corresponding to a crossing point of word line WLi and bit line BL4n+1. Memory cell MC4n+1 includes a capacitor 430 and an access transistor 402. Memory cell MC4n+2 is arranged corresponding to a crossing point of word line WLi and bit line BL4n+2. Memory cell MC4n+2 includes a capacitor 431 and an access transistor 403. Memory cell MC4n+3 is arranged corresponding to a crossing point of word line WLi and bit line BL4n+3. Memory cell MC4n+3 includes a capacitor 432 and an access transistor 404.

Array control circuit 202 includes a precharge/equalize circuit P/E precharging and equalizing paired bit lines BL and ZBL to a predetermined potential (Vcc/2: Vcc= operating power supply potential), a sense amplifier band SA differentially amplifying signal potentials on paired bit lines BL and ZBL, and a select gate band SG connecting four pairs of bit lines BL4n, ZBL4n to BL4n+3, ZBL4n+3 to an internal input/output bus IOa according to a column select signal Yn from Y decoder 203.

The precharge/equalize circuit of paired bit lines BL4n and ZBL4n includes n channel MOS transistors 405 and 406 transmitting intermediate potential Vcc/2 to bit lines BL4n and ZBL4n when rendered conductive, and an n channel MOS transistor 413 electrically connecting bit lines BL4n and ZBL4n when rendered conductive. The precharge/equalize circuit provided for paired bit lines BL4n+1 and ZBL4n+1 includes n channel MOS transistors 407 and 408 transmitting intermediate potential Vcc/2 to bit lines BL4n+1 and ZBL4n+1 when rendered conductive, and an n channel MOS transistor 414 electrically connecting bit lines BL4n+1 and ZBL4n+1 when rendered conductive.

The precharge/equalize circuit provided for paired bit lines BL4n+2 and ZBL4n+2 includes n channel MOS transistors 409 and 410 transmitting intermediate potential Vcc/2 to bit lines BL4n+2 and ZBL4n+2 when rendered conductive, and an n channel MOS transistor 415 electrically connecting bit lines BL4n+2 and ZBL4n+2 when rendered conductive.

The precharge/equalize circuit provided for paired bit lines BL4n+3 and ZBL4n+3 includes n channel MOS transistors 411 and 412 transmitting intermediate potential Vcc/2 to bit lines BL4n+3 and ZBL4n+3 when rendered conductive, and an n channel MOS transistor 416 electrically connecting bit lines BL4n+3 and ZBL4n+3 when rendered conductive. These MOS transistors 405 to 416 are rendered conductive when a bit line precharge instruct signal BLEQ is at the H level. Bit line precharge instruct signal BLEQ is brought into an active state at the H level at standby (or in resetting operation: at the time of deactivation of row address strobe signal ZRAS) of the semiconductor memory device.

Sense amplifier band SA includes a sense amplifier 425 provided for paired bit lines BL4n and ZBL4n, a sense amplifier 426 provided for paired bit lines BL4n+1 and ZBL4n+1, a sense amplifier 427 provided for paired bit lines BL4n+2 and ZBL4n+2, and a sense amplifier 428 provided for paired bit lines BL4n+3 and ZBL4n+3.

Select gate band SG includes transfer gates 417 and 418 connecting bit lines BL4n and ZBL4n to data input/output lines I/O0a and ZI/O0a when rendered conductive, transfer gates 419 and 420 connecting bit lines BL4n+1 and ZBL4n+1 to input/output lines I/O1a and ZI/O1a when rendered conductive, transfer gates 421 and 422 connecting bit lines BL4n+2 and ZBL4n+2 to input/output lines I/O2a and ZI/O2a when rendered conductive, and transfer gates 423 and 424 connecting bit lines BL4n+3 and ZBL4n+3 to input/output lines I/O3a and ZI/O3a when rendered conductive.

Operation will now be described briefly.

When word line WLi is selected (the potential is increased) in response to a word line drive signal from X decoder 206, the gate potentials of access transistors 401 to 404 are increased. Before the word line is selected, precharge/equalize instruct signal BLEQ is brought to the L level in a non-active state, and MOS transistors 405 to 416 of the precharge/equalize circuits are all in a non-conductive state. Therefore, the potentials on bit lines BL4n to BL4n+3 are changed from precharge potential (intermediate potential Vcc/2) according to electric charge stored in capacitors 429 to 432. Then, sense amplifiers 425 to 428 of sense amplifier band SA are activated, and data transmitted onto bit lines BL4n to BL4n+3 are amplified. Simultaneously, these data are latched by sense amplifiers 425 to 428.

Then, the potential on a column select line Yn is brought to the H level indicating a selected state in response to a column select signal CSL0 from Y decoder 203, and transfer gates 417 to 424 are all rendered conductive. As a result, storage data of 4-bit memory cells MC4n to MC4n+3 (data amplified by sense amplifiers 425 to 428) are transmitted onto input/output lines I/O0a, ZI/O0a to I/O3a, ZI/O3a.

As will be described later, one of these input/output line pairs I/O0a, ZI/O0a to I/O3a, ZI/O3a is selected by an input/output circuit, so that data is written or read out.

Figure 3:
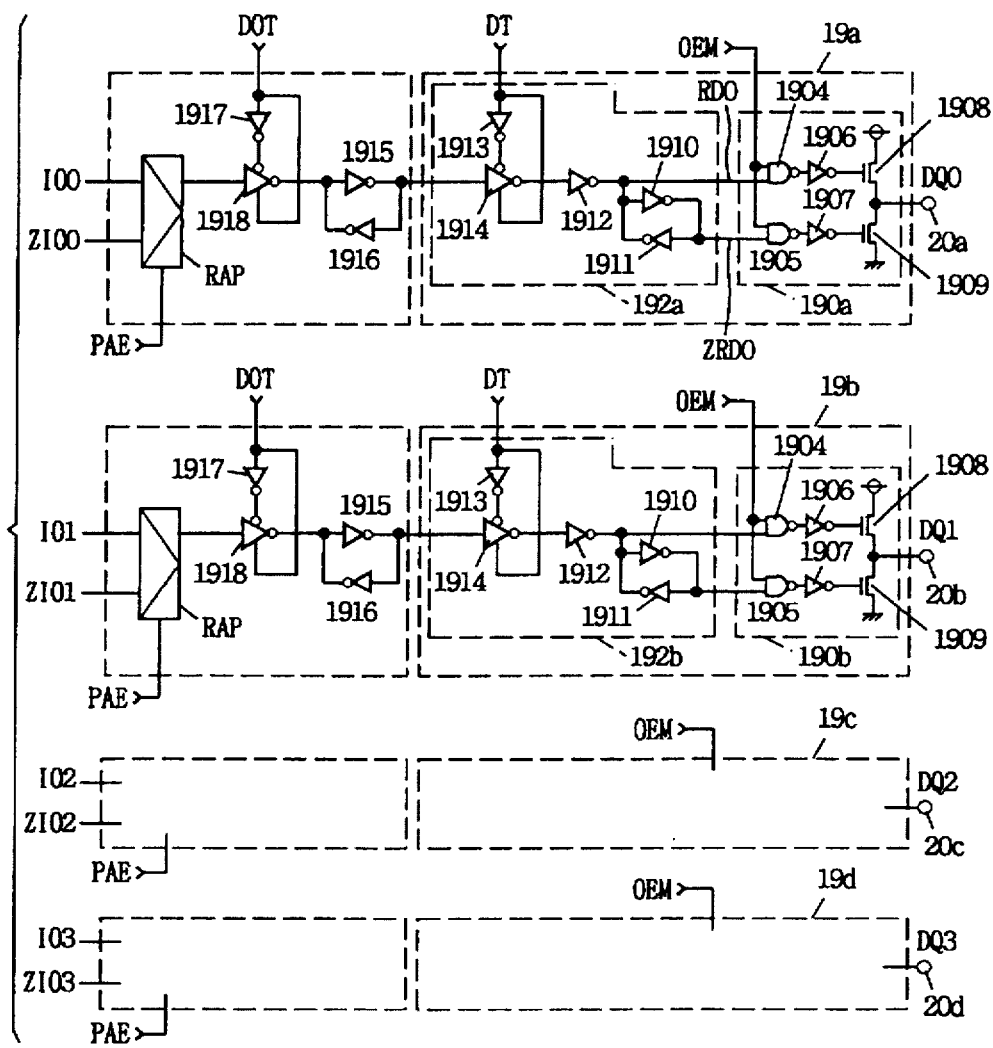
FIG. 3 is a schematic block diagram showing a configuration of a data reading circuit and an output circuit.

FIG. 3 schematically shows a configuration of a data reading portion relating to each of data input/output terminals 20a to 20d. Referring to FIG. 3, the reading portions corresponding to the respective data input/output terminals all have the same configuration basically. For example, a reading portion corresponding to data input/output terminal 20a includes a read amplifier RAP having its input connected to paired IO lines IO0 and ZIO0 among paired IO lines IO0, ZIO0 to IO3, ZIO3 transmitting 4-bit memory cell data selected simultaneously and amplifying read data in response to a preamplifier enable signal PAE, a clocked inverter circuit 1918 receiving the output of read amplifier RAP and controlled by a signal DOT activated in response to activation of preamplifier enable signal PAE, a first latch circuit formed of inverter circuits 1915 and 1916 for receiving and holding the output of clocked inverter circuit 1918, and output buffer circuit 19a receiving the output of the first latch circuit.

Clocked inverter circuit 1918 is controlled by signal DOT and a signal obtained by signal DOT being inverted by inverter circuit 1917.

Output buffer circuit 19a includes a data output circuit 192a receiving the output of inverter circuit 1915 configuring the first latch circuit as input under the control of a signal DT activated in response to activation of internal column address strobe signal ZCASF, and an output driving circuit 190a receiving the output of data output circuit 192a to output read data DQ0 corresponding to data input/output terminal 20a under the control of signal OEM.

Data output circuit 192a includes an inverter circuit 1913 receiving signal DT, a clocked inverter circuit 1914 controlled by signal DT and the output of inverter circuit 1913 and receiving the output of inverter circuit 1915, an inverter circuit 1912 receiving the output of clocked inverter circuit 1914 to output an inversion signal on a read data line RBUS, and a second latch circuit formed of inverter circuits 1910 and 1911 receiving and holding the output of inverter circuit 1912 to output a corresponding signal to read data bus line ZRBUS.

Output driving circuit 190a includes a 2-input NAND gate 1904 receiving output buffer activation signal OEM and a signal on read data bus line ZRBUS, an inverter 1906 inverting the output signal of NAND gate 1904, an n channel MOS transistor (insulating gate type field effect transistor) 1908 rendered conductive when the output signal of inverter 1906 is at the H level for supplying current to data output terminal DQ, an NAND gate 1905 receiving a signal on read data bus line ZRBUS and output buffer activation signal OEM, an inverter 1907 inverting the output signal of NAND gate 1905, and an n channel MOS transistor 1909 rendered conductive when the output signal of inverter 1907 is at the H level for discharging data output terminal DQ to the ground potential Vss level.

Figure 4:
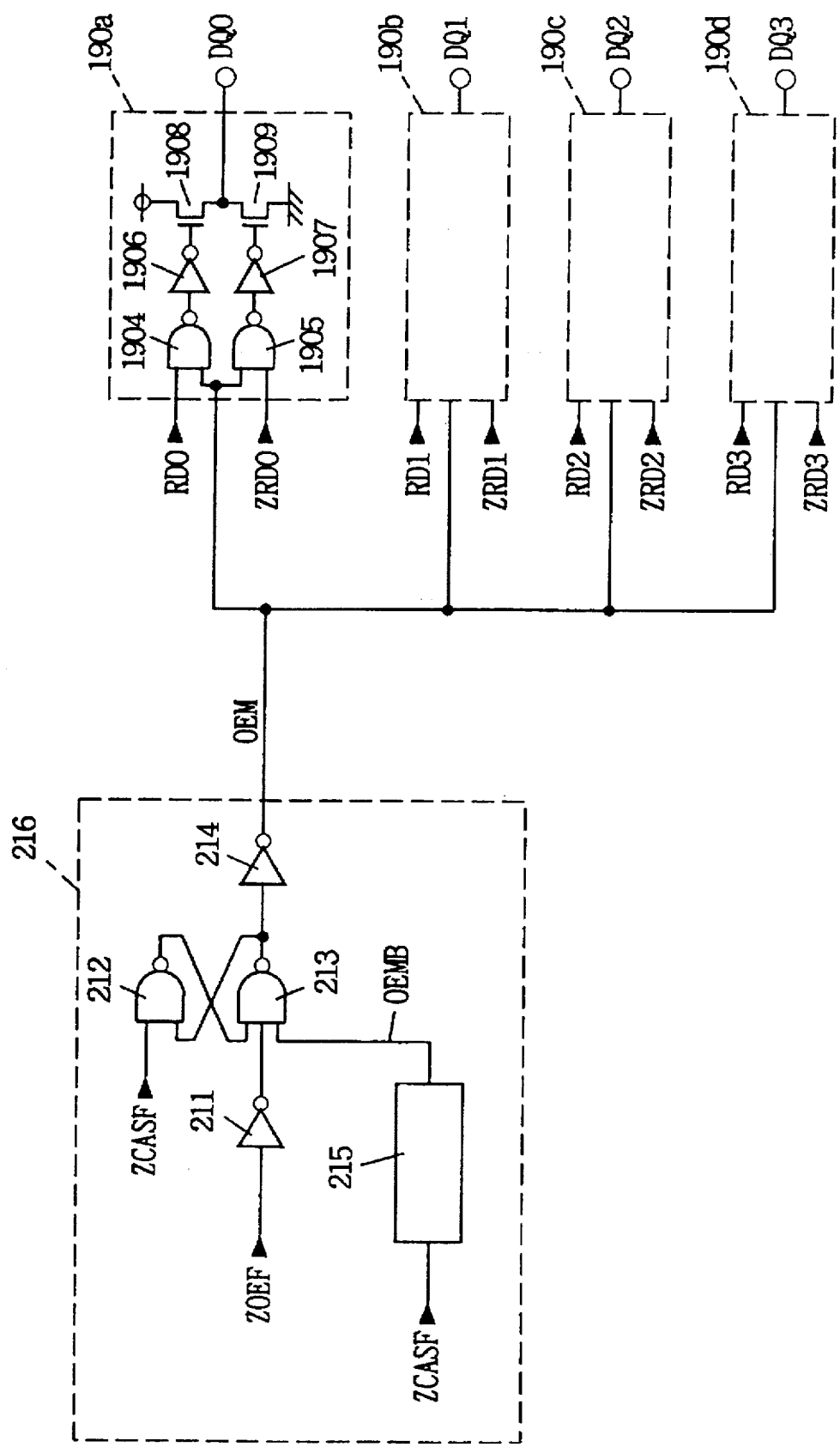
FIG. 4 is a circuit block diagram showing a configuration of the output circuit and an output buffer control circuit.

FIG. 4 is a schematic block diagram showing a configuration of output driving circuits 190a to 190d (hereinafter generally referred to as "OEM") shown in FIG. 3 and a circuit 216 generating control signal OEM controlling their operation.

Referring to FIG. 4, output driving circuits 190a to 190d are included corresponding to data input/output terminals DQ0 to DQ3. These circuits are controlled by signal OEM in common. Output driving circuits 190a to 190d are included in output buffer circuits+input buffer circuits 19a to 19d in the configuration of the semiconductor memory device shown in FIG. 1. Since output driving circuits 190a to 190d are the same as output driving circuit OEM shown in FIG. 3 in configuration, the same or corresponding portions are labeled with the same reference characters and the description thereof will not be repeated.

As described with reference to FIG. 2, read data from four memory cells selected simultaneously by the same column select interconnection line Yn are amplified by read amplifier RAP via IO bus. After that, the read data have their output timings controlled by data output circuits 192a to 192d to be applied to corresponding output driving circuits 190a to 190d, respectively. More specifically, output driving circuits 190a to 190d receive as input signals RD0, ZRD0 to RD3, ZRD3 corresponding to data read out from respective corresponding memory cells, that is, read data output from data output circuits 192a to 192d when signal DT is activated. When signal OEM is brought into an active state (H level) in this state, potential levels of the respective input/output terminals are driven to potential levels corresponding to read data DQ0 to DQ3, respectively.

Output buffer control circuit 216 includes a latency circuit 215 receiving internal column address strobe signal ZCASF to detect a predetermined timing of change of signal ZCASF to bring its output signal OEMB into an active state, an inverting circuit 211 receiving internal output enable signal ZOEF generated by control signal generating circuit 11 based on external output enable signal EXT./OE, an NAND circuit 212 receiving signal ZCASF as one input, a 3-input NAND circuit 213 receiving the output of NAND circuit 212, the output of inverting circuit 211, and signal OEMB as input and having its output node connected to the other input node of NAND circuit 212, and an inverting circuit 214 receiving the output of NAND circuit 213 to provide signal OEM.

NAND circuit 212 has its output connected to one input of NAND circuit 213 and vice versa. These NAND circuits 212 and 213 operate as a flip-flop circuit controlled by signal ZCASF, signal ZOEF, and signal OEMB.

More specifically, while an external output enable signal is in a non-active state and signal ZOEF is in a non-active state (H level), one input to NAND circuit 213 attains the L level. Therefore, the output of NAND circuit 213 is fixed to the H level, and signal OEM is always at the L level.

On the other hand, when signal ZOEF is in an active state (L level), latency circuit 215 detects a predetermined timing, and its output signal OEMB is in an active state (H level), signal OEM changes from the L level to the H level in response to signal ZCASF input to NAND circuit 212 changing from the H level to the L level. After that, while signal ZOEF and signal OEMB are both in an active state, signal OEM maintains the H level irrespective of change of signal ZCASF. In response to a non-active state (H level) of signal ZOEF, signal OEM is also to transition to a non-active state (L level).

Figure 5:
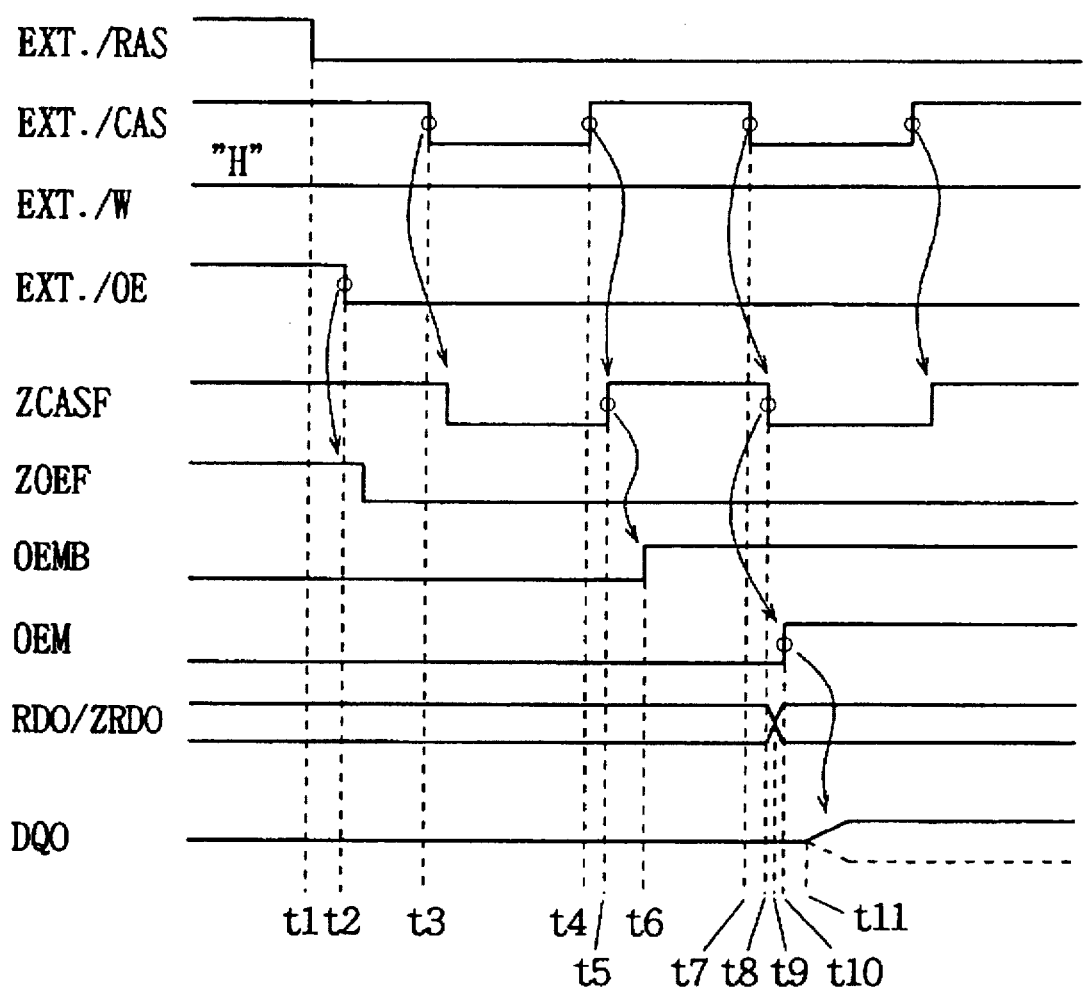
FIG. 5 is a timing chart showing operation of the output circuit and the output buffer control circuit shown in FIG. 4.

FIG. 5 is a timing chart for describing operation of output driving circuit OEM and output buffer control circuit 216 shown in FIG. 4.

In this timing chart, attention is paid only to a terminal providing signal DQ0 among the data input/output terminals.

In response to external output enable signal EXT./OE changing to an active state (L level) at time t2, internal output enable signal ZOEF is also brought into an active state. On the other hand, in response to external row address strobe signal EXT./RAS being at the L level and signal EXT./W being at the H level when external column address strobe signal EXT./CAS changes to the L level at time t3, the reading operation is specified. At the same time, in response to the falling of signal EXT./CAS, internal column address strobe signal ZCASF also changes to an active state.

In response to signal EXT./CAS attaining the H level again at time t4, signal ZCASF also attains the H level. As will be described later, output signal OEMB of latency circuit 215 is brought into an active state (H level) at time t6. Therefore, at this point, the potential levels of two input nodes of 3-input NAND circuit 213 in output buffer control circuit 216 are both at the H level.

On the other hand, in response to the falling of signal EXT./CAS at time t3, a reading related circuit is driven. In response to signal EXT./CAS again attaining the L level at time t7, internal column address strobe signal ZCASF falls to the L level at time t8. In response to this, the potential levels of input nodes of 3-input NAND circuit 213 in output buffer control circuit 216 all attain the H level, and the output signal thereof changes to the L level. More specifically, at time t10, output buffer control signal OEM changes to an active state. At time t9, on the other hand, input signals RD0 and ZRD0 to data output circuit 192a change their levels corresponding to the read data. In response to these, read data DQ0 is provided from output driving circuit 190a at time t11.

Only after detecting in a pipeline burst EDO mode the second change of signal ZCASF to an active state, that is, change of signal ZCASF from the H level to the L level at time t9 in FIG. 5, conventional output buffer control circuit 216 started to bring output buffer control signal OEM into an active state (H level) accordingly.

On the contrary, in the present embodiment, signal OEMB is brought into an active state in response to the first change of signal ZCASF to a non-active state in the pipeline burst EDO mode, that is, change from the L level to the H level at time t5 in FIG. 5. Therefore, it is possible to change output buffer control signal OEM to an active state with a minimum delay time with respect to the second transition of signal ZCASF to an active state (time t9).

Figure 6:
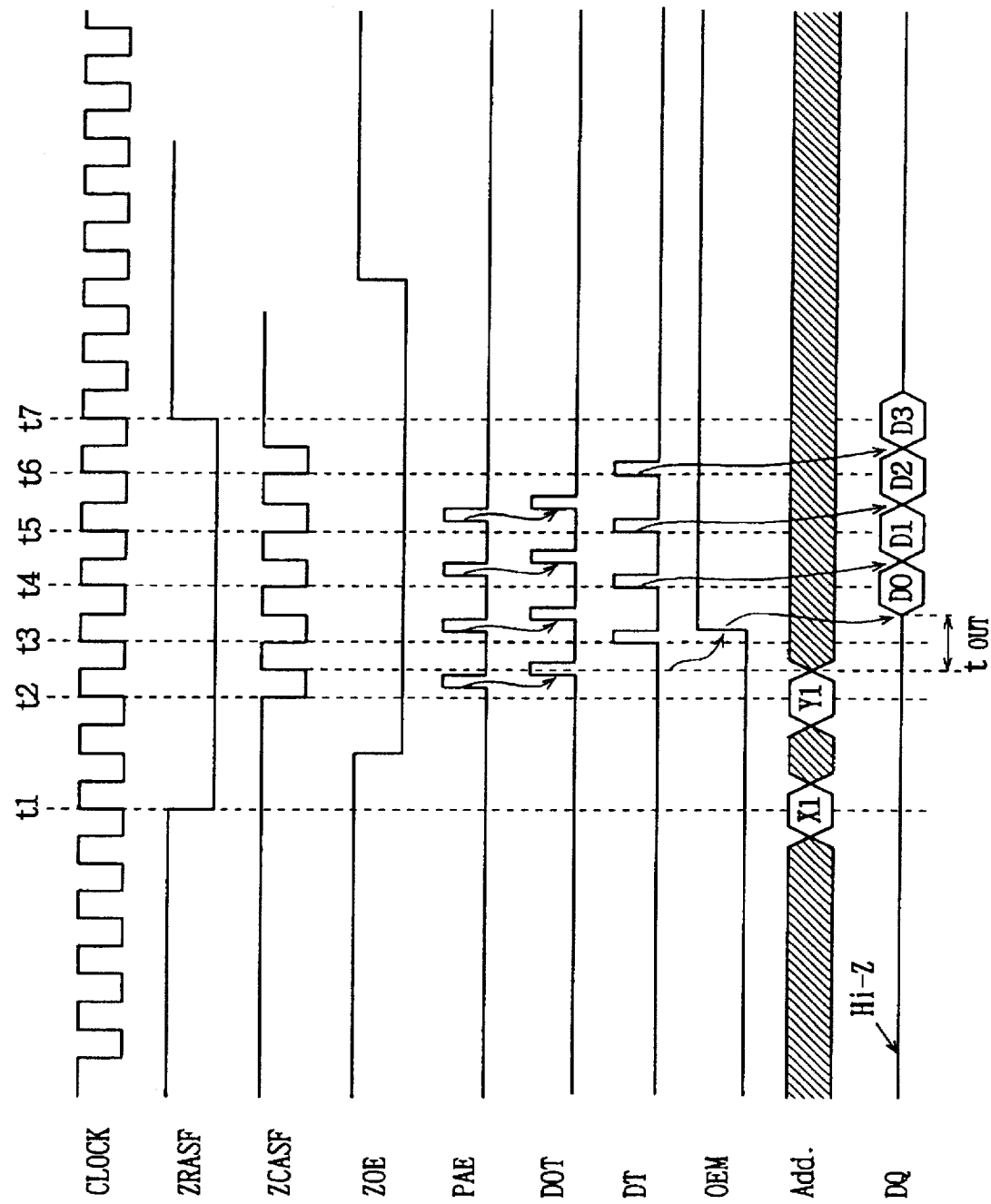
FIG. 6 is a timing chart showing reading operation in a pipeline burst EDO (Extended Data Output) mode of the semiconductor memory device according to the first embodiment.

FIG. 6 is a timing chart for describing the reading operation of the semiconductor memory device according to the first embodiment based on operation of output driving circuit OEM and the output buffer control circuit shown in FIG. 4, which should be compared to the timing chart of the conventional semiconductor memory device shown in FIG. 22 in the pipeline burst EDO mode.

At time t1, in response to change of the external row address strobe signal, internal row address strobe signal ZRASF is brought into an active state. In response to this, row address X1 is entered. At time t2, in response to activation of the external column address strobe signal, signal ZCASF is brought into an active state. In response to this, column address Y1 is entered, and reading operation from a corresponding memory cell is started.

More specifically, in response to the falling edge of signal ZCASF at time t2, storage data in the memory cell is amplified by the sense amplifier and provided to a corresponding IO line pair. Then, preamplifier enable signal PAE activating read amplifier RAP is brought into an active state (H level), and read amplifier RAP amplifies read data transmitted from a corresponding IO line pair for output.

In response to activation of signal PAE, signal DOT is also brought into an active state (H level), and clocked inverter circuit 1918 in FIG. 3 is brought into an active state. As a result, read data amplified by read amplifier RAP is held by the first latch circuit formed of inverter circuits 1915 and 1916.

Then, in response to change of signal ZCASF to a non-active state during one cycle from times t2 to t3, that is, in response to the rising edge of signal ZCASF to the H level, operation of output buffer control circuit 216 is started.

In response to transition of signal ZCASF to an active state in the second cycle at time t3, that is, in response to the falling edge of signal ZCASF to the L level, signal DT is brought into an active state, and clocked inverter circuit 1914 in FIG. 3 is brought into an active state. The output of inverter circuit 1912 receiving the output of clocked inverter circuit 1914 is held by the second latch circuit formed of inverter circuits 1910 and 1911. The output of inverter circuit 1912 and the output of the second latch circuit are provided to output driving circuit 190a and the like, and read data DQ0 to DQ3 are provided to corresponding data input/output terminals 20a to 20d.

On the other hand, in response to the falling edge of signal ZCASF at time t3, output buffer activation signal OEM is brought into an active state, starting output of read data D0. Since the circuit operation for controlling the output buffer has already been started in the cycle from time t2 to time t3 in this case, a sufficient time can be secured for time $t_{out}$ allotted for controlling the output buffer. Therefore, at the activation edge in the third cycle of signal ZCASF at time t4, output signal D0 has already been defined, enabling normal reading operation.

In the following cycles, that is, at data reading timings at times t6 and t7, output buffer activation signal OEM has already been brought into an active state. In response to the falling of signal ZCASF, data is sequentially output whenever signal DT is activated. Therefore, even if cycle time tPC of system clock CLOCK becomes short, normal data reading operation can be carried out.

Figure 7:
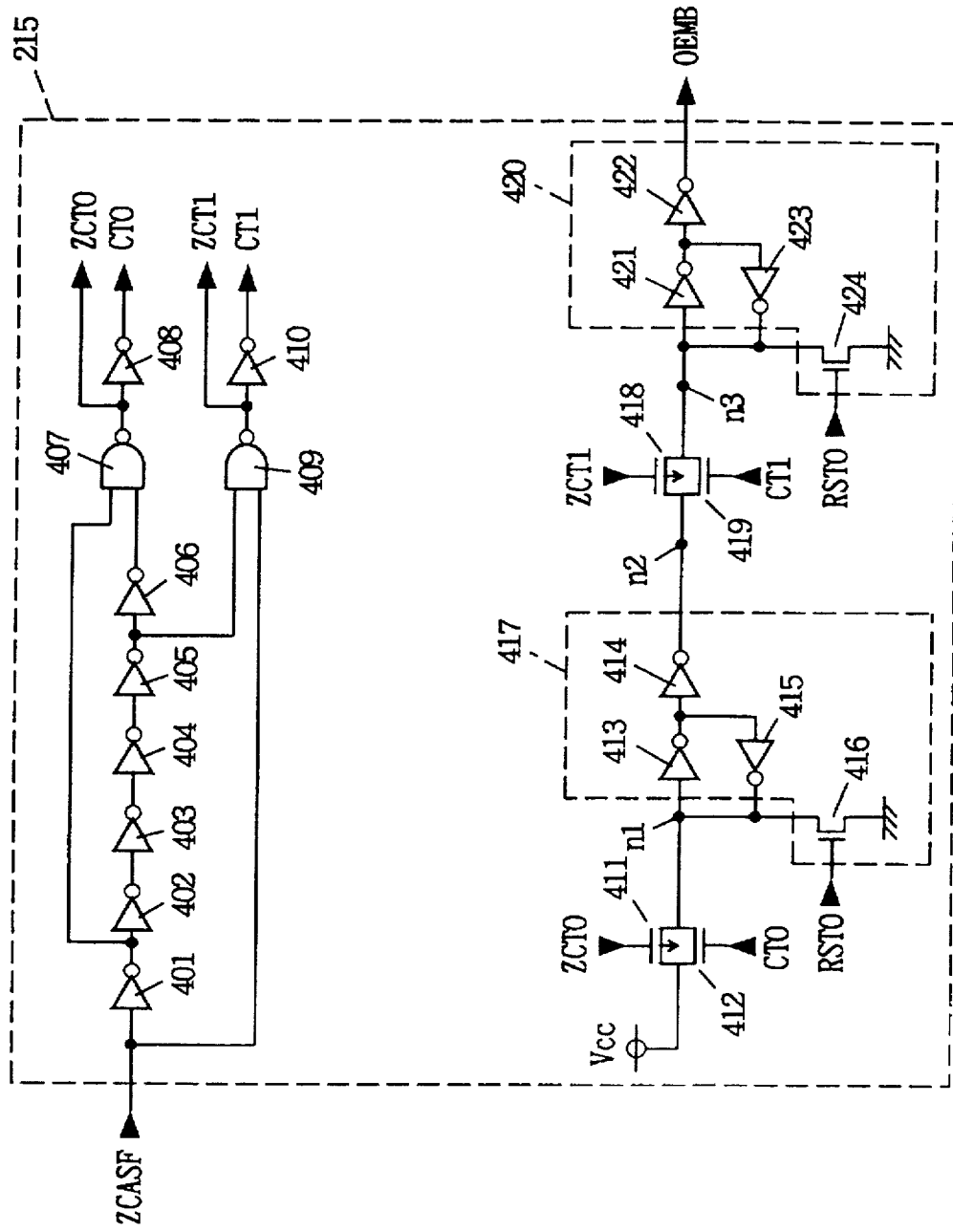
FIG. 7 is a circuit block diagram showing a configuration of a latency circuit 215.

FIG. 7 is a circuit diagram of the main portion showing a configuration of latency circuit 215 in output buffer control circuit 216 shown in FIG. 4.

Latency circuit 215 includes an inverter circuit 401 receiving internal column address strobe signal ZCASF, inverter circuits 403, 404, 405 and 406 sequentially connected in series to an inverter circuit 402 receiving the output of inverter circuit 401, an NAND circuit 407 receiving the output of inverter circuit 401 and the output of inverter circuit 406 to provide a signal ZCT0, an inverter circuit 408 receiving the output of NAND circuit 407 to output a first count up signal CT0, an NAND circuit 409 receiving signal ZCASF and the output of inverter circuit 405 to provide a signal ZCT1, and an inverter circuit 410 receiving the output of NAND circuit 409 to provide a second count up signal CT1.

More specifically, signals ZCT0 and CT0 change in a complementary manner with a difference of a delay time of inverter circuit 408. Signals CT1 and ZCT1 change in a complementary manner with a difference of a delay time of inverter circuit 410.

Signals CT0 and ZCT0 are generated in response to signal ZCASF falling from the H level to the L level. Signals CT0 and ZCT0 have a pulse length corresponding to a delay time of inverter circuits 402 to 406 connected in series.

On the other hand, signals CT1 and ZCT1 are generated in response to the rising edge of signal ZCASF from the L level to the H level. Signals CT1 and ZCT1 have a pulse length corresponding to a delay time of inverter circuits 401 to 405 connected in series.

Latency circuit 215 further includes a first transmission gate circuit connected between a node supplied with power supply potential Vcc and a node n1, a latch circuit 417 connected between nodes n1 and n2, a second transmission gate connected between nodes n2 and n3, and a latch circuit 420 having an input node connected to node n3 and outputting signal OEMB.

The first transmission gate circuit includes a p channel MOS transistor 411 connected between the power supply node and node n1 and receiving signal ZCT0 complementary to the first count up signal at its gate, and an n channel MOS transistor 412 connected between the power supply node and node n1 and receiving first count up signal CT0 at its gate.

Latch circuit 417 includes an inverter circuit 413 having its input node connected to node n1, an inverter circuit 415 receiving the output of inverter circuit 413 and having its output node connected to node n1, an inverter circuit 414 receiving the output of inverter circuit 413 and having its output node connected to node n2, and an n channel MOS transistor 416 connected between node n1 and the ground node and receiving a reset signal RST0 at its gate.

The second transmission gate circuit includes a p channel MOS transistor 417 connected between nodes n2 and n3 and receiving signal ZCT1 complementary to the second count up signal at its gate, and an n channel MOS transistor 418 connected between nodes n2 and n3 and receiving second count up signal CT1 at its gate.

Latch circuit 420 includes an inverter circuit 421 having its input node connected to node n3, an inverter circuit 423 receiving the output of inverter circuit 421 and having its output node connected to node n3, an inverter circuit 422 receiving the output of inverter circuit 421 and providing signal OEMB, and an n channel MOS transistor 424 connected between node n3 and the ground node and receiving reset signal RST0 at its gate.

Operation of latency circuit 215 will now be described.

Figure 8:
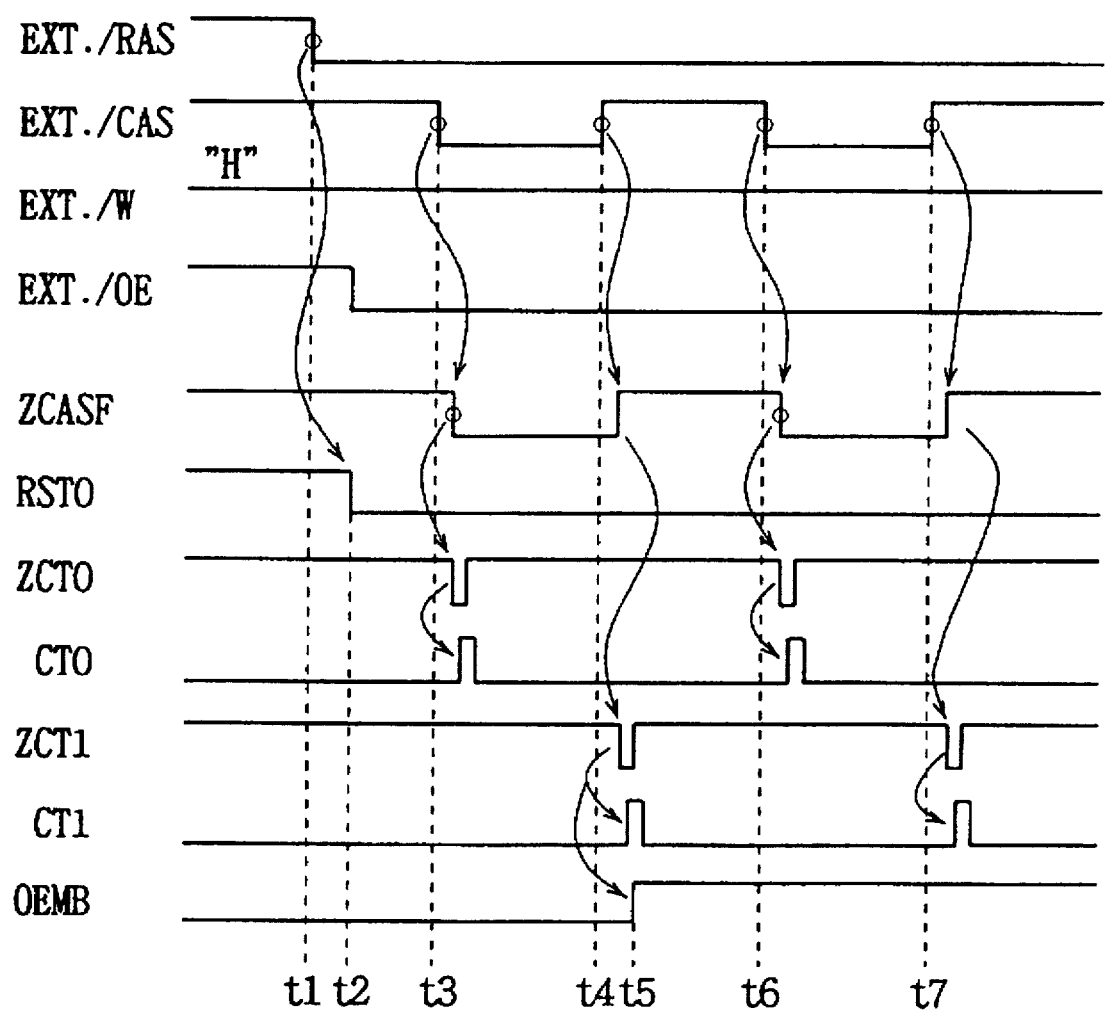
FIG. 8 is a timing chart describing operation of latency circuit 215.

FIG. 8 is a timing chart showing operation of latency circuit 215.

At time t1, external row address strobe signal EXT./RAS falls to the L level. Since reset signal RST0 is at the H level at this time, n channel MOS transistors 416 and 423 in FIG. 7 are both rendered conductive, and nodes n1 and n3 are both at the L level. Accordingly, signal OEMB is also in a non-active state (L level).

At time t2, reset signal RST0 falls to the L level. However, the potential levels of nodes n1 and n3 are maintained at the L level by latch circuits 418 and 419.

In response to external column address strobe signal EXT./CAS falling to the L level at time t3, internal column address strobe signal ZCASF also falls to the L level. Accordingly, signal ZCT0 complementary to the first count up signal has a predetermined pulse length, and is brought into an active state at the L level. On the other hand, first count up signal CT0 also has a predetermined pulse length, and is brought into an active state at the H level.

Accordingly, the first transmission gate constituted of transistors 411 and 412 is rendered conductive, the potential level of node n1 attains the H level, and this state is held by latch circuit 417. Therefore, the potential level of node n2 which is the output node of latch circuit 417 also attains the H level.

In response to external column address strobe signal EXT./CAS rising from the L level into a non-active state at time t4, internal column address strobe signal ZCASF also rises from the L level. Accordingly, second count up signal CT1 changes to the H level, and signal ZCT1 changes to the L level. These signals are brought into an active state with a predetermined pulse length.

Accordingly, the second transmission gate constituted of transistors 418 and 419 is also rendered conductive, and the potential level of node n3 also increases to the H level. This potential level is held by latch circuit 420. Signal OEMB which is the output signal of latch circuit 420 changes from the L level to the H level in an active state at time t5.

After that, in response to change of signal ZCASF, the first count up signal and the second count up signal are both brought into an active state with a predetermined pulse length. However, the potential levels of nodes n1, n2 and n3 do not change, and therefore, signal OEMB maintains the H level.

Signal OEMB again changes to a non-active state (L level) by external row address strobe signal EXT./RAS changing to a non-active state, and reset signal RST0 attaining the H level accordingly, thereby the potential levels of nodes n1 and n3 attaining the L level.

Therefore, signal OEMB changes to an active state at time t5 in response to transition of external column address strobe signal EXT./CAS from an active state to a non-active state in the first cycle, that is, transition from the L level to the H level being generated at time t4.

In the above description, latency circuit 215 is configured to be brought into an active state in response to transition of signal ZCASF from an active state to a non-active state in the first cycle. However, by changing the configuration of latency circuit 215, this activation timing can be adapted to transition of signal ZCASF from an active state to a non-active state in another cycle.

For example, latency circuit 215 can be configured so that a third transmission gate is connected to the output node of the second latch circuit, the third transmission gate is controlled by first count up signal CT0 and signal ZCT0, a third latch circuit is further connected through the third transmission gate, a fourth transmission gate controlled by signals CT1 and ZCT1 receives the output of the third latch circuit, and so that a fourth latch circuit receives the output of the fourth transmission gate for providing signal OEMB. In this case, signal OEMB is to change to an active state in response to transition of signal ZCASF from an active state to a non-active state in the second cycle.

Signal OEMB may change in response to transition from an active state to a non-active state in another cycle.

[Second Embodiment]

Figure 9:
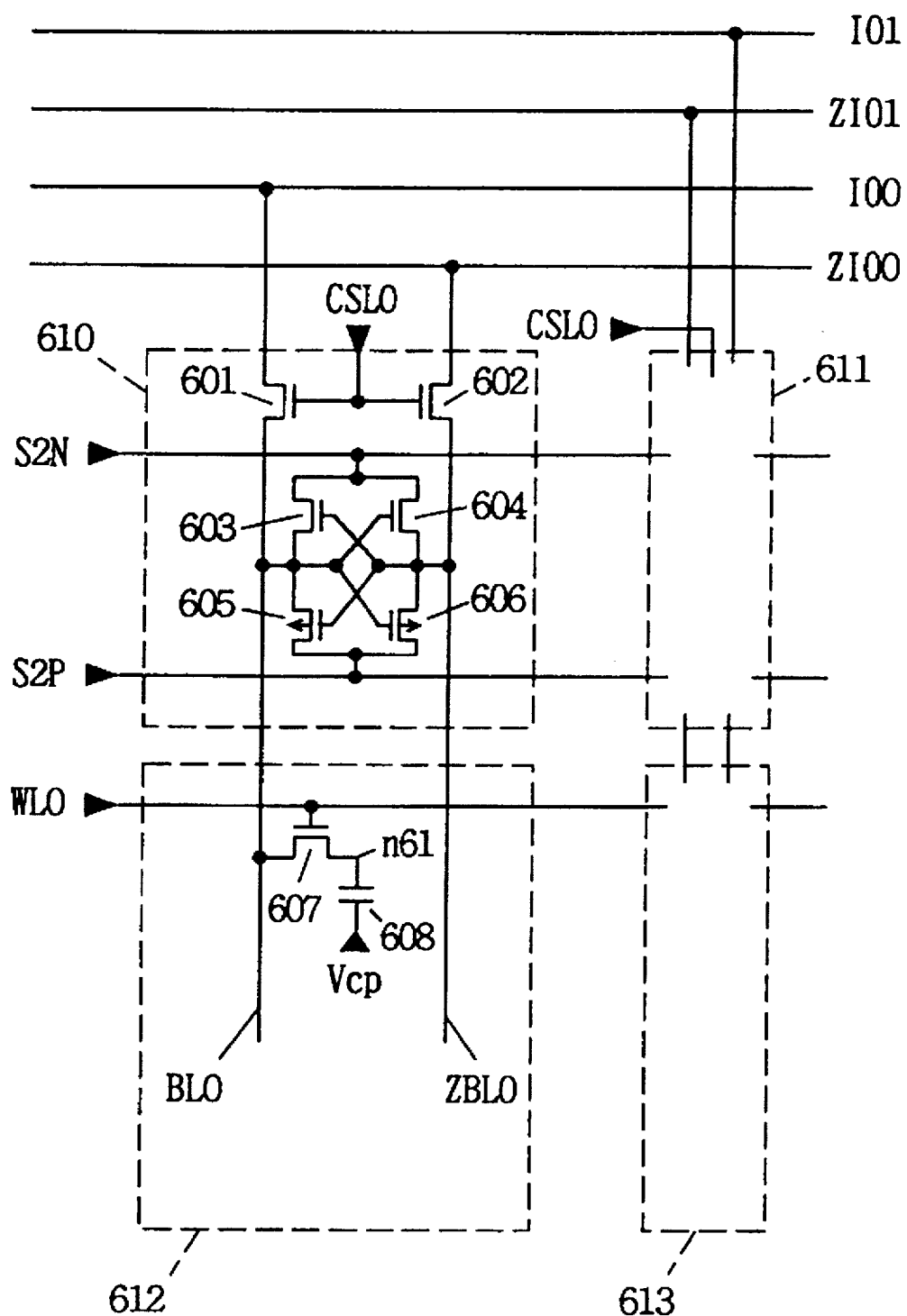
FIG. 9 is a circuit block diagram of the main portion showing a configuration of a sense amplifier+IO circuit of a semiconductor memory device according to a second embodiment.

A semiconductor memory device according to the second embodiment is substantially the same as semiconductor memory device 1000 according to the first embodiment shown in FIG. 1 in configuration. FIG. 9 shows a configuration of a portion of sense amplifier+I/O circuit 16 and memory cell array 15 in FIG. 1. FIG. 9 is a circuit diagram showing the sense amplifier portion in more detail than FIG. 2.

In FIG. 9, only the main part of a sense amplifier portion 610 and a memory cell portion 612 is shown.

Referring to FIG. 9, an n channel MOS transistor 601 is connected between data bus IO0 and bit line BL0 and receives column select line signal CSL0 at its gate. An n channel MOS transistor 602 is connected between data bus ZIO0 and bit line ZBL0 and receives column select signal CSL0 at its gate. More specifically, paired bit lines BL0, ZBL0 and data buses IO0, ZIO0 are connected/disconnected by column select signal CSL0.

The sense amplifier includes n channel MOS transistors 603 and 604, and p channel MOS transistors 605 and 606.

The n channel MOS transistor 603 receives a first sense amplifier drive signal S2N at its source, with its drain connected to bit line BL0 and its gate connected to bit line ZBL0. The n channel MOS transistor 604 receives first sense amplifier drive signal S2N at its source, with its drain connected to bit line ZBL0 and its gate connected to bit line BL0.

The p channel MOS transistor 605 receives a second sense amplifier drive signal S2P at its source, with its drain connected to bit line BL0 and its gate connected to bit line ZBL0. The p channel MOS transistor 606 receives second sense amplifier drive signal S2P at its source, with its drain connected to bit line ZBL0 and its gate connected to bit line BL0.

The n channel MOS transistor 607 is connected between bit line BL0 and a node n61, with its gate connected to word line WL0.

A memory cell capacity 608 is connected between node n61 and a cell plate power supply node Vcp.

Therefore, the sense amplifier is activated according to activation of first sense amplifier drive signal S2N and second sense amplifier drive signal S2P. Memory cell capacity 608 has its one end connected to bit line BL0 according to activation (change to the H level) of word line WL0.

Figure 10:
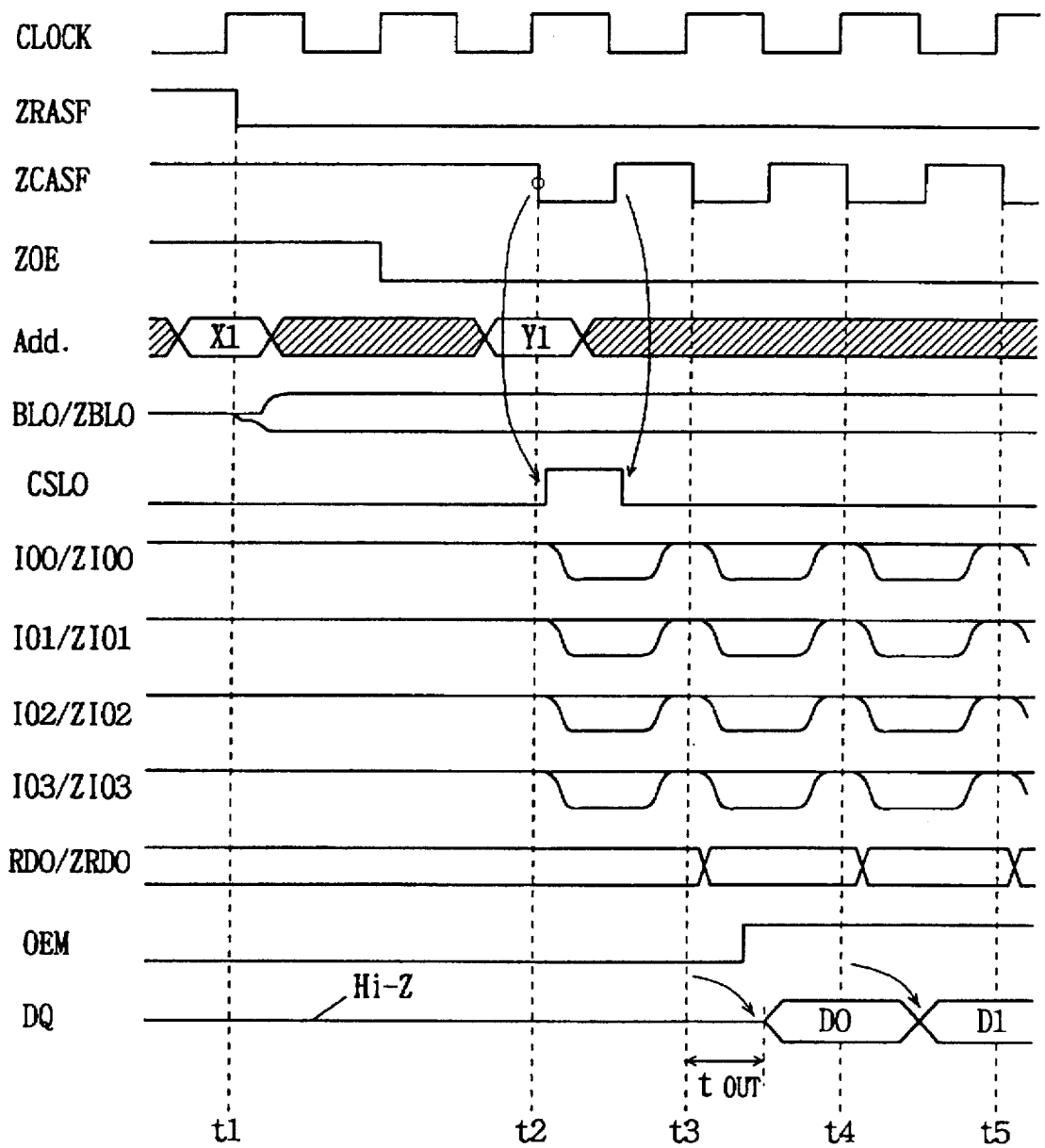
FIG. 10 is a first timing chart showing reading operation in the pipeline burst EDO mode of the semiconductor memory device according to the second embodiment.

FIG. 10 is a timing chart showing reading operation in the pipeline burst EDO mode of the semiconductor memory device shown in FIG. 9.

In response to an external clock signal, internal row address strobe signal ZRASF is brought into an active state (L level) at time t1. At this time, a signal applied to the address signal input terminal is entered as row address signal X1.

In response to activation of signal ZRASF, first and second sense amplifier drive signals S2N and S2P are activated. According to storage information stored in memory cell capacity 608, the potential difference between paired bit lines BL0 and ZBL0 is amplified by the sense amplifier.

In response to change of internal column address strobe signal ZCASF to an active state (change from the H level to the L level) at time t2, a signal applied to the address input terminal at this time point is entered as column address signal Y1. Accordingly, column select signal CSL0 for a corresponding memory cell column is activated. As a result, paired bit lines BL0 and ZBL0 and corresponding paired IO lines IO0 and ZIO0 are connected, and the potential difference corresponding to read data appears on the IO line pair.

On the other hand, if four memory cell columns, for example, are selected simultaneously by column select signal CSL0, three remaining IO line pairs IO1, ZIO1, IO2, ZIO2, and IO3, ZIO3 are connected to their corresponding bit line pairs. The potential levels of the respective IO line pairs also change according to storage information in the respective corresponding memory cells. In response to this, input signals RD0 and ZRD0 to the output circuit corresponding to data output terminal 20a, for example, also change to complementary potential levels according to corresponding read data.

At this time, in an ordinary pipeline burst EDO mode operation, output buffer control signal OEM is brought into an active state in response to the activation edge of signal ZCASF in the second cycle at time t3. Accordingly, read data DQ0 is output to data input/output terminal 20a.

This operation applies to the other data input/output terminals 20b to 20d.

In the above description, there was a margin in a cycle time of change of external clock signal CLOCK with respect to a time required for the reading operation of the semiconductor memory device.

Figure 11:
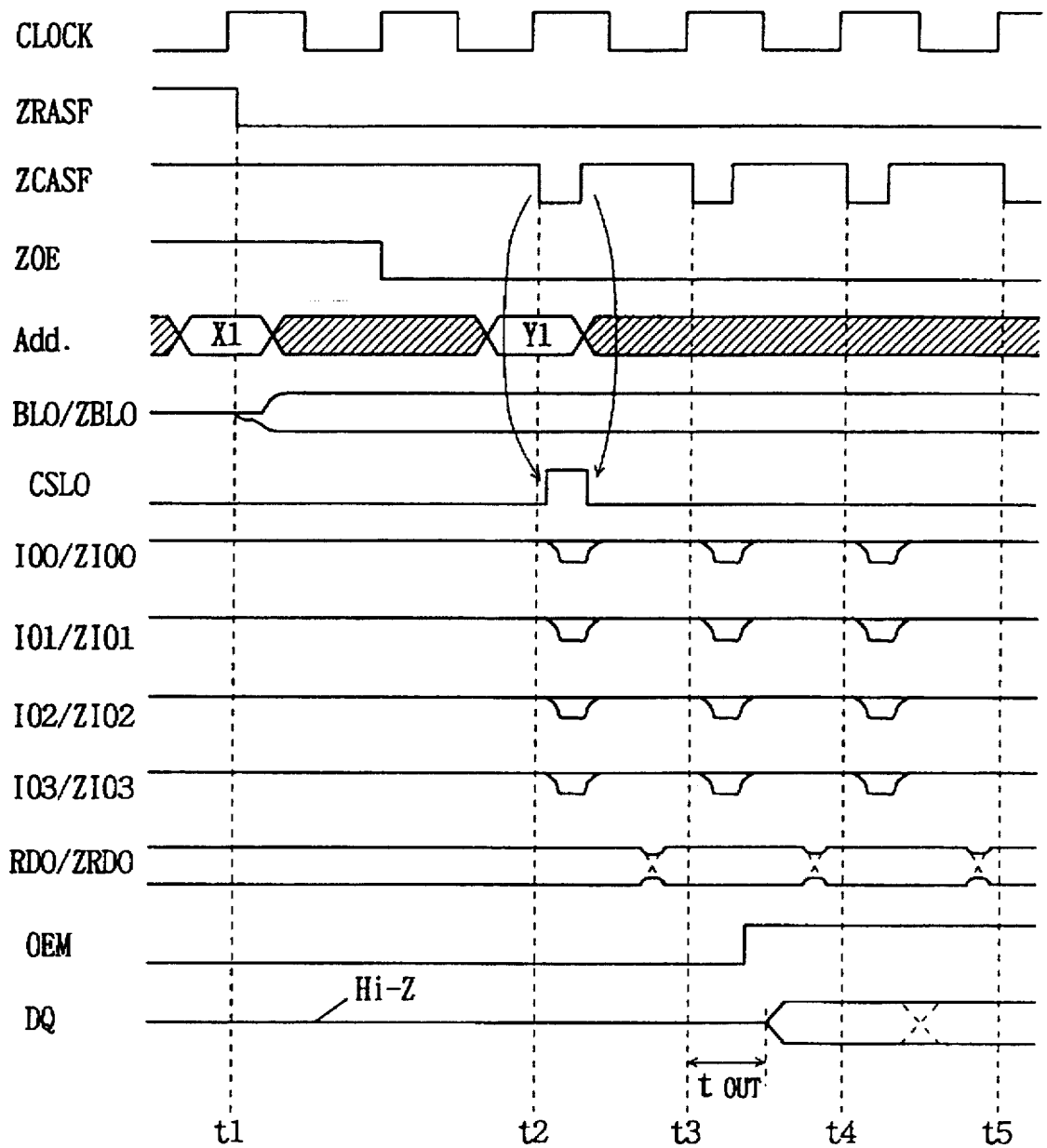
FIG. 11 is a timing chart showing operation when a duty ratio in the reading operation is decreased.

FIG. 11 is a timing chart showing reading operation in the pipeline burst EDO mode in the case where the external clock signal changes at a higher speed, and where the time required for the reading operation of the semiconductor memory device is approximately the same as the cycle time of external clock signal CLOCK.

In this case, the problem is the reduced active period of a control signal caused by a skew of the control signal and the like.

More specifically, even when a ratio of the active period to the cycle time of the external clock signal, that is, when a duty ratio is 1 for example, an internal control signal which changes in synchronism with this external clock signal, that is, internal column address strobe signal ZCASF sometimes has a decreased duty ratio due to a signal skew and the like. In other words, even if decrease in the active period by a signal skew and the like is the same in absolute value, this decrease in the active period cannot sometimes be ignored since the cycle time per se becomes shorter.

The circumstances will be described hereinafter in more detail with reference to FIG. 11.

At time t1, internal row address strobe signal ZRASF is activated. In response to this, row address signal X1 is entered, and the sense amplifier is started. Therefore, the potential difference between paired bit lines BL0 and ZBL0, for example, also changes to a corresponding potential difference according to storage information in memory cells belonging to the selected row. At time t2, in response to activation of the external clock signal, internal column address strobe signal ZCASF is activated. In response to this, column address signal Y1 is entered, and column select signal CSL0 is activated. In this case, if the duty ratio of signal ZCASF is decreased, the decrease of an activation period of column select signal CSL0 is greater than that of the cycle time. Therefore, by signal CSL0 being brought into a non-active state before the potential difference between paired IO lines IO0 and ZIO0 connected to paired bit lines BL0 and ZBL0 by column select signal CSL0 sufficiently changes, the connection between paired bit lines BL0 and ZBL0 and paired IO lines IO0 and ZIO0 is broken. The same thing is applied to the other paired IO lines IO1, ZIO1 to IO3, ZIO3 selected simultaneously.

Therefore, a complementary potential difference according to information read out from corresponding memory cells will not be generated in input signals RD0 and ZRD0 to the output circuit corresponding to data input/output terminal 20a, for example.

Therefore, even if output buffer control signal OEM is activated in response to activation of signal ZCASF at time t3, only erroneous data is provided from the output buffer corresponding to data input/output terminal 20a.

Figure 12:
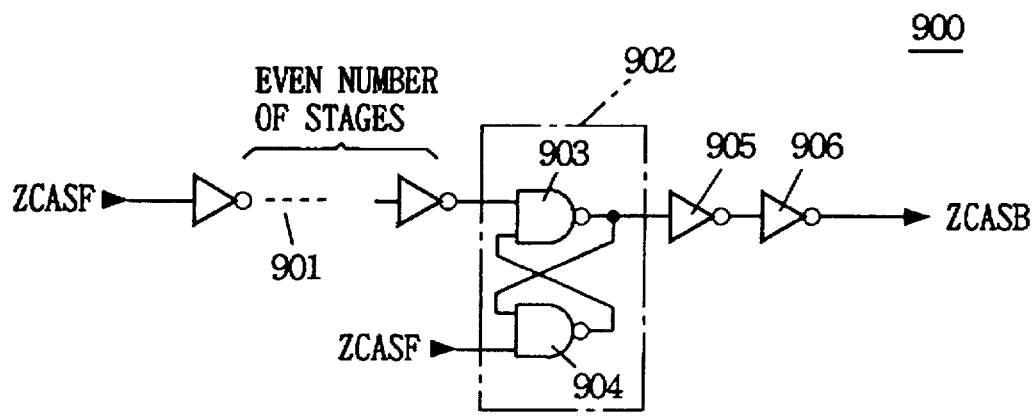
FIG. 12 is a circuit block diagram showing a configuration of an internal clock generating circuit 900 according to the second embodiment.

In order to prevent such a problem as described above, control signal generating circuit 11 in the semiconductor memory device shown in FIG. 1 includes an internal clock generating circuit 900 generating a second internal column address strobe signal ZCASB shown in FIG. 12, in the second embodiment.

Internal clock generating circuit 900 includes an inverter train 901 receiving signal ZCASF and including inverters connected in series in an even number of stages, a flip-flop circuit 902 receiving the output of inverter train 901 and signal ZCASF, an inverter circuit 905 receiving the output of flip-flop circuit 902, and an inverter circuit 906 receiving the output of inverter circuit 905 to output second internal column address strobe signal ZCASB.

Flip-flop circuit 902 includes an NAND circuit 903 receiving the output of inverter train 901 as one input, and an NAND circuit 904 receiving signal ZCASF at one input and the output of NAND circuit 903 at the other input and having its output node connected to the other input node of NAND circuit 903.

Operation of internal clock generating circuit 900 shown in FIG. 12 will now be described.

Figure 13:
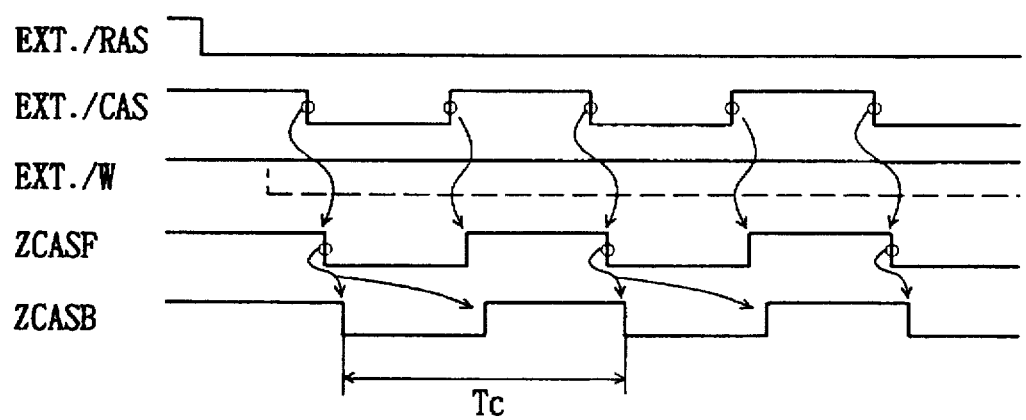
FIG. 13 is a first timing chart showing operation of internal clock generating circuit 900 shown in FIG. 12.
Figure 14:
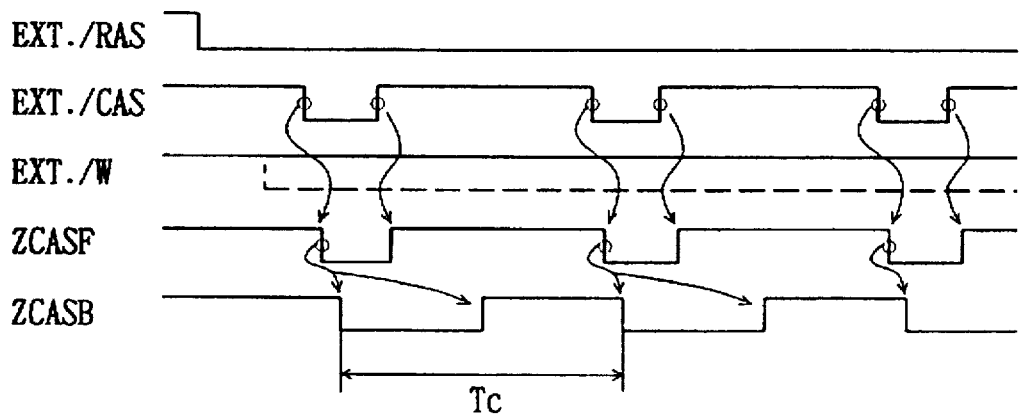
FIG. 14 is a second timing chart showing operation of internal clock generating circuit 900 shown in FIG. 12.

FIGS. 13 and 14 are timing charts showing change of signals ZCASF and ZCASB with respect to change of external column address strobe signal EXT./CAS.

In FIG. 13, external column address strobe signal EXT./CAS changes in synchronism with change of system clock CLOCK, and the duty ratio is approximately 1. On the other hand, in FIG. 14, the duty ratio of external column address strobe signal EXT./CAS to cycle time Tc is less than 1, because change of system clock CLOCK is influenced by a signal skew and the like.

Referring to FIG. 13, when external column address strobe signal EXT./CAS is at the H level in a non-active state, both first internal column address strobe signal ZCASF and the output of inverter train 901 are at the H level. Therefore, the output level of flip-flop circuit 902 is also at the H level, and second internal column address strobe signal ZCASB is also at the H level.

In response to external column address strobe signal EXT./CAS changing from the H level to the L level, first internal column address strobe signal ZCASF also falls to the L level. Accordingly, as for the inputs to flip-flop circuit 902, signal ZCASF is at the L level, and the output of inverter train 901 is at the L level. Therefore, the output of flip-flop circuit 902 also changes from the H level to the L level, and second internal column address strobe signal ZCASB also falls to the L level. In response to the output signal of inverter train 901 falling to the L level after a delay time of inverter train 901, two inputs to flip-flop circuit 902 both attain the L level, and the output thereof rises to the H level. Therefore, second internal column address strobe signal ZCASB also changes to the H level.

More specifically, internal clock signal generating circuit 900 changes the level of the output signal from the H level to the L level in response to the falling of first internal column address strobe signal ZCASF, and changes the output level from the L level to the H level after a delay time in inverter train 901 including series-connected inverters in an even number of stages.

Therefore, irrespective of the duty ratio of first internal column address strobe signal ZCASF, that is, the duty ratio of external column address strobe signal EXT./CAS, second internal column address strobe signal ZCASB having a constant pulse length is provided.

This characteristic appears more significantly when the duty ratio of external column address strobe signal EXT./CAS is decreased, as shown in FIG. 14.

More specifically, even when the duty ratio of first internal column address strobe signal ZCASF is decreased as the duty ratio of external column address strobe signal EXT./CAS decreases, the duty ratio of second internal column address strobe signal ZCADB does not change, and it is always to change as a signal having a constant pulse length.

The semiconductor memory device according to the second embodiment can carry out normal reading operation even if the duty ratio of external column address strobe signal EXT./CAS is decreased, by using second internal column address strobe signal ZCASB instead of internal column address strobe signal CASF which controls the column related operation of the semiconductor memory device according to the first embodiment.

The above described circumstances bring about the similar effects not only in reading operation but also in data writing operation of a semiconductor memory device which operates in the pipeline burst EDO mode.

Figure 15:
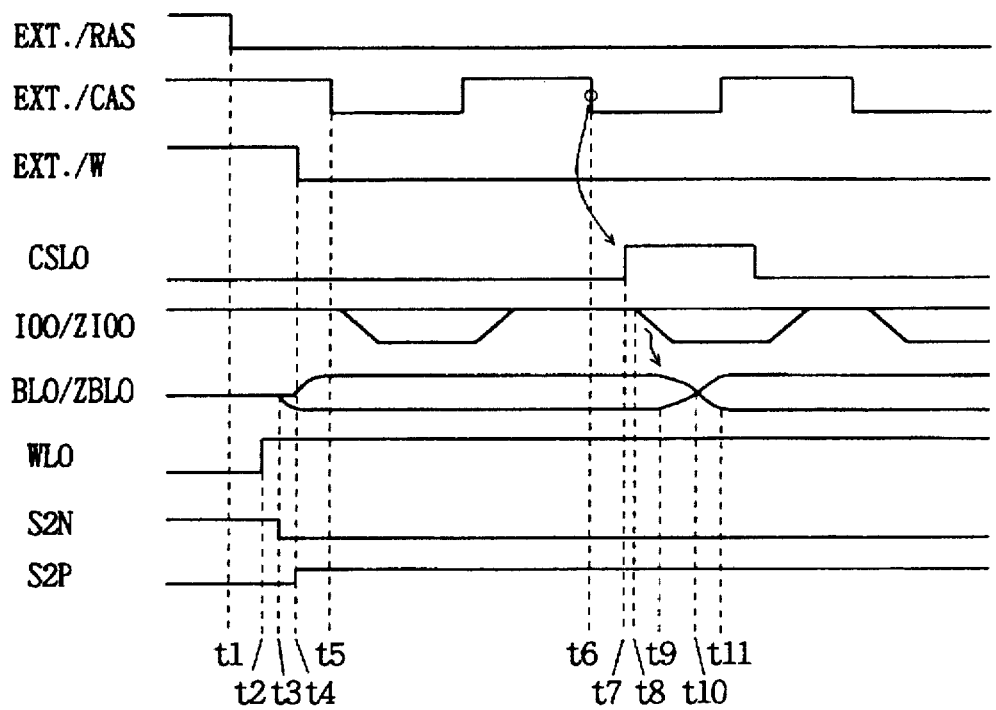
FIG. 15 is a timing chart showing writing operation of the semiconductor memory device according to the second embodiment.

FIG. 15 is a timing chart showing data writing operation of the semiconductor memory device which can operate in the pipeline burst EDO mode.

In response to external row address strobe signal EXT./RAS falling to the L level at time t1, a drive signal WL0 for a selected word line changes to the H level at time t2, and the memory cell capacity in the memory cell and one of corresponding paired bit lines BL0 and ZBL0 are connected. In response to activation of sense amplifier activation signal S2N at time t3, the sense amplifier starts operating, and the potential levels of paired bit lines BL0 and ZBL0 begin to change. Further, in response to activation of second Sense amplifier activation signal S2P at time t4, the potential difference between paired bit lines BL0 and ZBL0 is amplified. On the other hand, according to external write data, paired IO lines IO0 and ZIO0 begin to change to corresponding potential levels according to the write data.

Referring to FIG. 15, since paired bit lines BL0 and ZBL0 are not selected in change of external column address strobe signal EXT./CAS in the first cycle, the potential levels of paired IO lines IO0 and ZIO0 do not have any influence on the potential levels of paired bit lines BL0 and ZBL0.

In response to activation of signal EXT./CAS in the second cycle at time t6, column select signal CSL0 is activated. In response to this, paired IO lines IO0 and ZIO0 whose potential levels are changed according to write data and paired bit lines BL0 and ZBL0 are connected, the potential levels of the paired bit lines change according to the write data, and the information is written in a memory cell.

Figure 16:
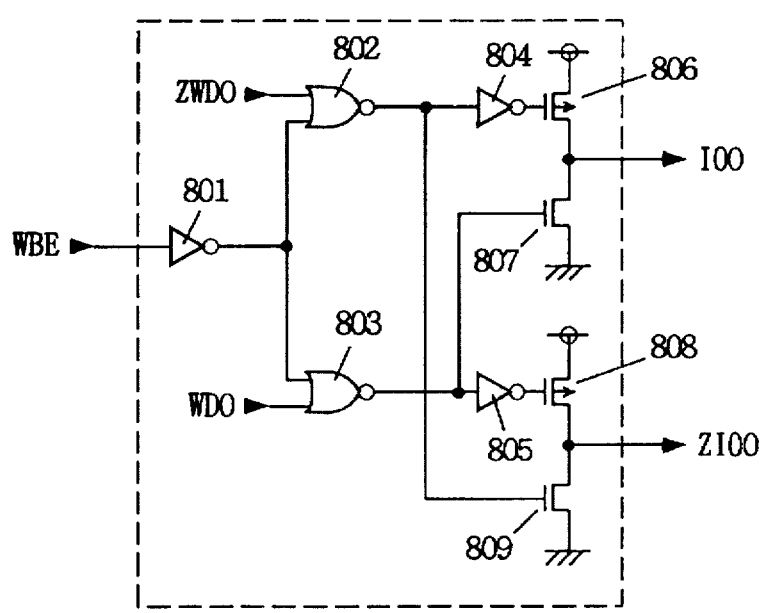
FIG. 16 is a circuit block diagram showing an input circuit of the semiconductor memory device according to the second embodiment.

FIG. 16 is a circuit diagram showing a part of the configuration of the input circuit included in output buffer circuits+input buffer circuits 19a to 19d in the semiconductor memory device shown in FIG. 1.

An inverter 801 receives a write control signal WBE. NOR circuits 802 and 803 receive the output of inverter 801 at respective one inputs, and write signals ZWD0 and WD0 at the respective other inputs.

An inverter 804 receives the output of NOR circuit 802. A p channel MOS transistor 806 and an n channel MOS transistor 807 are connected in series between power supply potential Vcc and ground potential Vss. The gate of p channel MOS transistor 806 receives the output of inverter 804, and the gate of n channel MOS transistor 807 receives the output of NOR circuit 803.

An inverter 805 receives the output of NOR circuit 803. A p channel MOS transistor 808 and an n channel MOS transistor 809 are connected in series between power supply potential Vcc and ground potential Vss. The gate of p channel MOS transistor 808 receives the output of inverter 805, and the gate of n channel MOS transistor 809 receives the output of NOR circuit 802.

The potential level at a connection point between p channel MOS transistor 806 and n channel MOS transistor 807 is output as write data IO0, and the potential level at a connection point between p channel MOS transistor 808 and n channel MOS transistor 809 is output as write data ZIO0.

Figure 17:
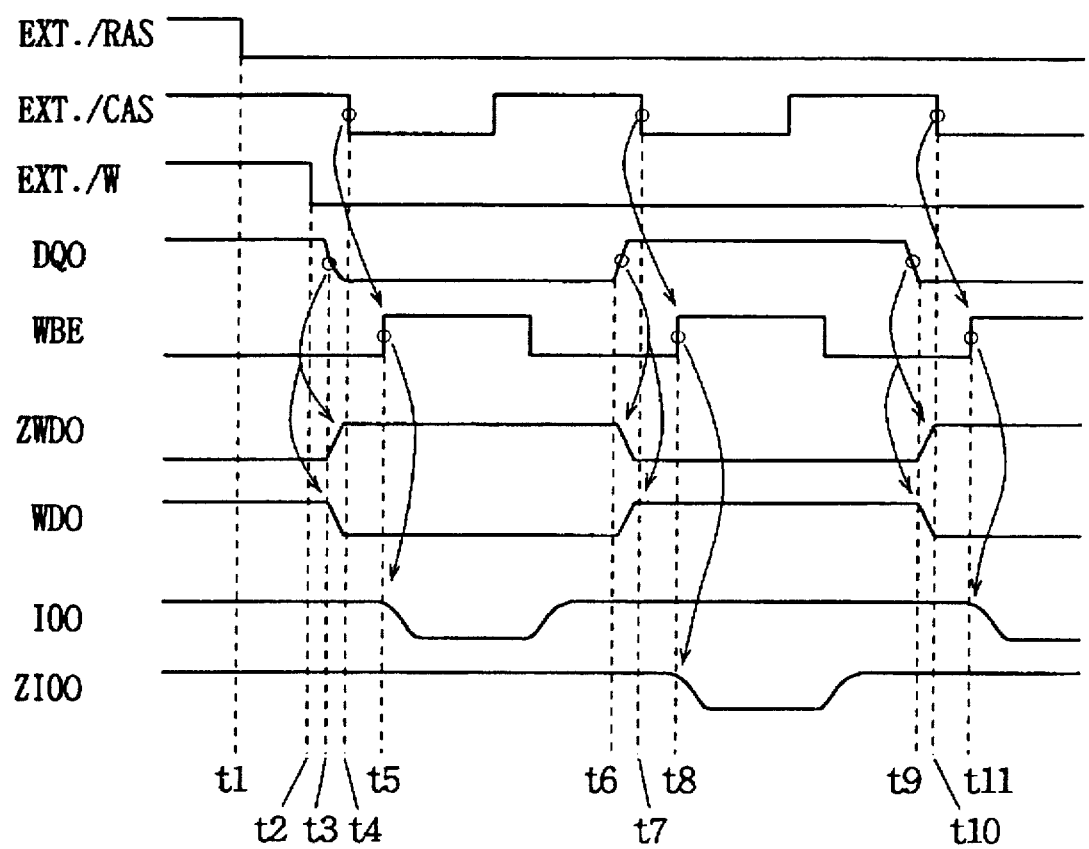
FIG. 17 is a timing chart for describing operation of the input circuit.

FIG. 17 is a timing chart for describing operation of the input circuit shown in FIG. 16.

At time t1, external row address strobe signal EXT./RAS falls, and an external write operation control signal EXT./W also falls to the L level at time t2.

At time t3, write data DQ0 is applied to data input/output terminal 20a. In response to this, write data WD0 and ZWD0 in FIG. 16 change to corresponding potential levels.

In response to the L level of external write operation control signal EXT./W at the time when external column address strobe signal EXT./CAS falls to the L level, a writing operation mode is specified at time t4. In response to this, an internal write operation control signal WBE changes to an active state at time t5. According to activation of signal WBE, transistors 806 and 807 and transistors 808 and 809 are driven in response to signals WD0 and ZWD0 applied to NOR circuits 802 and 803, respectively. The potential levels of paired IO lines IO0 and ZIO0 also change to values corresponding to the write data.

Corresponding data is written similarly for every change cycle of signal EXT./CAS hereafter.

Figure 18:
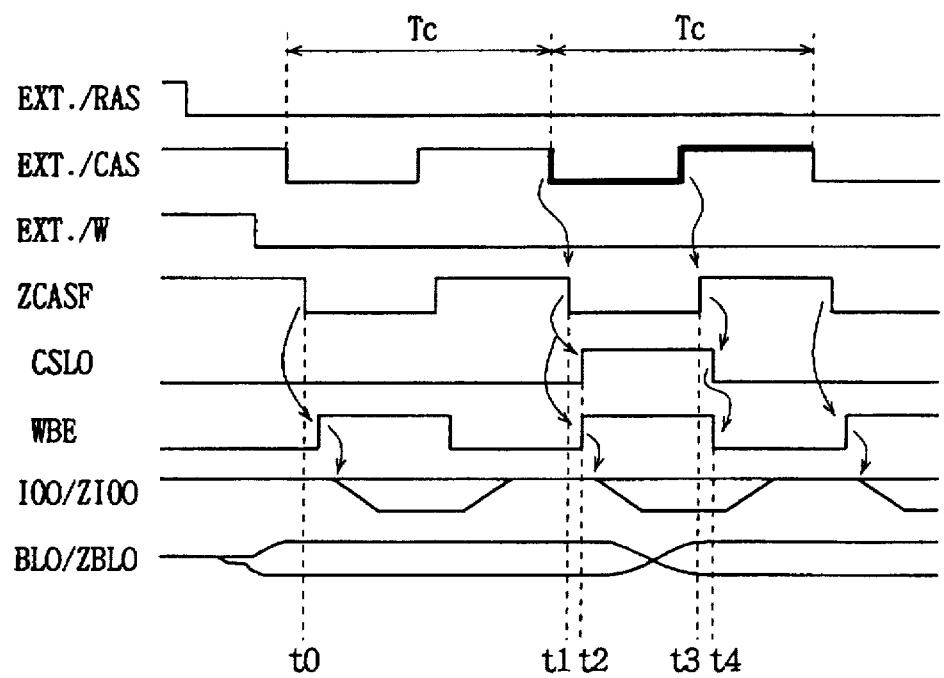
FIG. 18 is a first timing chart describing writing operation of the semiconductor memory device according to the second embodiment.
Figure 19:
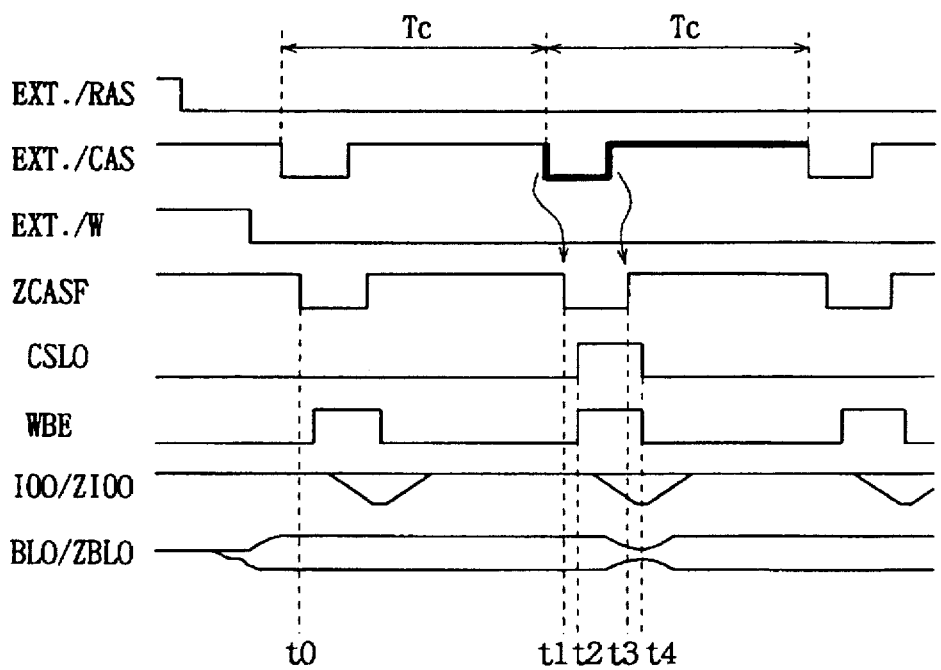
FIG. 19 is a second timing chart describing the writing operation of the semiconductor memory device according to the second embodiment.

FIGS. 18 and 19 are timing charts showing how writing operation changes with respect to change in the duty ratio of external column address strobe signal EXT./CAS.

In FIG. 18, the duty ratio of external column address strobe signal EXT./CAS to cycle time Tc is approximately 1, and in FIG. 19, the duty ratio of external column address strobe signal EXT./CAS to cycle time Tc is less than 1.

In FIG. 18, the duty ratio of signal EXT./CAS is approximately 1, and this signal has a sufficient active time. Therefore, the internal write operation control signal and column select signal CSL0 controlled by internal column address strobe signal ZCASF which changes according to signal EXT./CAS also have a sufficient pulse length. Therefore, if corresponding column select signal CSL0 is activated in response to activation of signal ZCASF at time t1, for example, corresponding paired IO lines IO0 and ZIO0 and paired bit lines BL0 and ZBL0 are connected. In response to activation of write operation control signal WBE, the potential levels of paired IO lines IO0 and ZIO0 are transmitted to paired bit lines BL0 and ZBL0, and the potential levels of the paired bit lines change according to the write data.

On the other hand, when the duty ratio of signal EXT./CAS becomes small and signals CSL0 and WBE have a shorter active period (period from time t2 to time t4), the potential levels of paired IO lines IO0 and ZIO0 are not sufficiently transmitted to paired bit lines BL0 and ZBL0, preventing normal data writing operation.

Even in this case, by controlling column select signal CSL0 and write operation control signal WBE by output signal ZCASB from internal clock generating circuit 900 shown in FIG. 12, a sufficient active period can be secured irrespective of the duty ratio of external column address strobe signal EXT./CAS, enabling normal writing operation.

[Third Embodiment]

FIG. 20 is a timing chart showing reading operation in the pipeline burst EDO mode of a semiconductor memory device including both a reading operation control circuit (output buffer control circuit 216) in the pipeline burst EDO mode shown in the first embodiment and internal clock generating circuit 900 shown in the second embodiment.

In response to the rising of external clock signal CLOCK at time t1, internal row address strobe signal ZRASF also falls. An address signal at this time point is entered as row address X1.

In response to the rising edge of system clock CLOCK at time t2, internal column address strobe signal ZCASF also attains an active state (L level). An address signal at this time point is entered as column address signal Y1. In this case, even if the duty ratio of internal column address strobe signal ZCASF is decreased, that of second internal column address strobe signal ZCASB does not change. Therefore, by controlling the column related circuit operation in response to second internal column address strobe signal ZCASB, the similar operation to that of the semiconductor memory device according to the first embodiment can be implemented.

More specifically, in response to the rising of system clock CLOCK at time t2, reading operation from a corresponding memory cell column to paired IO lines is started.

On the other hand, in response to transition of signal ZCASB from an active state to a non-active state (change from the L level to the H level) in a cycle from time t2 to time t3, the control operation of the output buffer circuit is started. Since a sufficient output related circuit operation time $t_{out}$ is secured even when the first bit data is read out at the rising edge of system clock CLOCK at time t4, normal reading operation can be carried out.

More specifically, in the third embodiment, when the cycle time of system clock signal CLOCK becomes shorter, even if the duty ratio of internal column address strobe signal ZCASF or the like is decreased, normal reading operation is implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a memory cell array having a plurality of memory cells arranged in rows and columns;
   column selecting means activated at the time of activation of a column address strobe signal for simultaneously selecting a plurality of columns of said memory cell array according to a column address signal;
   a plurality of data reading and amplifying means each for amplifying data of a memory cell of a corresponding column among said plurality of columns;
   data output means for sequentially providing data amplified by said plurality of data reading and amplifying means to an output buffer in synchronism with activation of said column address strobe signal; and
   output buffer control means responsive to any transition of said column address strobe signal from an active state to a non-active state for activating said output buffer.

2. A semiconductor memory device sequentially providing a plurality of read data from a plurality of memory cells selected simultaneously, in synchronism with a change cycle of a column address strobe signal in a predetermined operation mode, comprising:
   a memory cell array having a plurality of memory cells arranged in rows and columns;
   column selecting means responsive to a first activation transition of said column address strobe signal for simultaneously selecting a plurality of columns of said memory cell array specified by an external address signal;
   a plurality of data reading and amplifying means each for amplifying data of a memory cell of a corresponding column among said plurality of columns;
   latch means for receiving and holding outputs of said plurality of data reading and amplifying means;
   data output means receiving outputs of said latch means and responsive to an activation transition of said column address strobe signal for sequentially outputting said outputs of said latch means;
   output driving means receiving outputs of said data output means and responsive to an output buffer activation signal for externally outputting corresponding signals; and
   output buffer control means responsive to a first deactivation transition of said column address strobe signal for outputting said output buffer activation signal.

3. The semiconductor memory device according to claim 2, wherein
   said first activation transition and said first deactivation transition are included in the same cycle of change of said column address strobe signal.

4. The semiconductor memory device according to claim 2, wherein
   said output buffer control means includes
   means responsive to said first deactivation transition of said column address strobe signal for outputting an active internal output control signal, and
   means for sensing activation of said column address strobe signal for maintaining said output buffer control signal in an active state in a period during which an external read operation control signal and said internal output control signal are both active.

5. A semiconductor memory device, comprising:

a memory cell array having a plurality of memory cells arranged in rows and columns;

synchronization signal generating means for generating an internal clock signal having a predetermined pulse length in synchronism with an activation transition of a column address strobe signal;

column selecting means activated at the time of activation of said internal clock signal for simultaneously selecting a plurality of columns of said memory cell array according to a column address signal; and data input/output means for sequentially transmitting and receiving data between memory cells of a corresponding column among said plurality of columns and the outside world in synchronism with activation of said internal clock signal.

6. A semiconductor memory device, comprising:

a memory cell array having a plurality of memory cells arranged in rows and columns;

synchronization signal generating means for generating an internal clock signal having a predetermined pulse length in synchronism with an activation transition of a column address strobe signal;

column selecting means activated at the time of activation of said internal clock signal for simultaneously selecting a plurality of columns of said memory cell array according to a column address signal;

a plurality of data reading and amplifying means each for amplifying data of a memory cell of a corresponding column among said plurality of columns; and output control means for sequentially outputting data amplified by said plurality of data reading and amplifying means, in synchronism with activation of said internal clock signal.

7. A semiconductor memory device for sequentially outputting a plurality of read data from a plurality of memory cells selected simultaneously, in synchronism with an activation cycle of a column address strobe signal in a predetermined operation mode, comprising:

a memory cell array having a plurality of memory cells arranged in rows and columns;

synchronization signal generating means for generating an internal clock signal having a predetermined pulse length in synchronism with an activation transition of said column address strobe signal;

column selecting means responsive to a first activation transition of said internal clock signal for simultaneously selecting a plurality of columns of said memory cell array specified by an external address signal;

a plurality of data reading and amplifying means each for amplifying data of a memory cell of a corresponding column among said plurality of columns;

latch means for receiving and holding outputs of said plurality of data reading and amplifying means; and output control means receiving outputs of said latch means and responsive to an activation transition after said first activation transition of said internal clock signal for sequentially and externally providing said outputs of said latch means.

8. The semiconductor memory device according to claim 7, wherein said synchronization signal generating means includes a logic circuit having first and second input nodes and responsive to activation of an input signal to any one of the input nodes for inverting a level of an output signal, and a delay circuit receiving said column address strobe signal for outputting the same to said first input node with a delay time corresponding to said predetermined pulse length, said column address strobe signal being applied to said second input node.

9. A semiconductor memory device, comprising:

a memory cell array having a plurality of memory cells arranged in rows and columns;

synchronization signal generating means for generating an internal clock signal having a predetermined pulse length in synchronism with an activation transition of a column address strobe signal;

column selecting means activated at the time of activation of said internal clock signal for simultaneously selecting a plurality of columns of said memory cell array according to a column address signal;

a plurality of data reading and amplifying means each for amplifying data of a memory cell of a corresponding column among said plurality of columns;

data output means for sequentially applying data amplified by said plurality of data reading and amplifying means to an output buffer, in synchronism with activation of said internal clock signal; and output buffer control means responsive to any transition of said internal clock signal from an active state to a non-active state for activating said output buffer.

10. A semiconductor memory device for sequentially outputting a plurality of read data from a plurality of memory cells selected simultaneously, in synchronism with an activation cycle of a column address strobe signal in a predetermined operation mode, comprising:

a memory cell array having a plurality of memory cells arranged in rows and columns;

synchronization signal generating means for generating an internal clock signal having a predetermined pulse length in synchronism with an activation transition of said column address strobe signal;

column selecting means responsive to a first activation transition of said internal clock signal for simultaneously selecting a plurality of columns of said memory cell array specified by an external address signal;

a plurality of data reading and amplifying means each for amplifying data of a memory cell of a corresponding column among said plurality of columns;

latch means for receiving and holding outputs of said plurality of data reading and amplifying means; and data output means receiving outputs of said latch means and responsive to an activation transition of said internal clock signal for sequentially providing said outputs of said latch means;

output driving means receiving an output of said data output means and responsive to an output buffer activation signal for externally outputting a corresponding signal; and output buffer control means responsive to a first deactivation transition of said internal clock signal for outputting said output buffer activation signal.

11. The semiconductor memory device according to claim 10, wherein said first activation transition and said first deactivation transition are included in the same cycle of change of said column address strobe signal.

* * * * *